United States Patent
Kobayashi et al.

(10) Patent No.: US 7,218,103 B2
(45) Date of Patent: May 15, 2007

(54) METHODS FOR MANUFACTURING A THIN FILM MAGNETIC SENSOR

(75) Inventors: Nobukiyo Kobayashi, Natori (JP); Kiwamu Shirakawa, Sendai (JP); Yasushi Kaneta, Nagoya (JP)

(73) Assignees: The Foundation: The Research Institute for Electric and Magnetic Materials, Sendai-shi, Miyagi (JP); Daido Steel Co., Ltd., Nagoya-shi, Aichi-ken (JP)

( * ) Notice: Subject to any disclaimer, the term of this patent is extended or adjusted under 35 U.S.C. 154(b) by 0 days.

(21) Appl. No.: 11/455,331

(22) Filed: Jun. 19, 2006

(65) Prior Publication Data

US 2006/0226835 A1    Oct. 12, 2006

Related U.S. Application Data

(62) Division of application No. 10/853,619, filed on May 24, 2004.

(30) Foreign Application Priority Data

Jun. 2, 2003   (JP)   ............................. 2003-156551

(51) Int. Cl.
G01R 33/09   (2006.01)
G01R 33/02   (2006.01)

(52) U.S. Cl. ..................................... 324/252

(58) Field of Classification Search ............... 324/252, 324/249, 207.21, 244; 360/326, 324, 324.2, 360/324.11; 438/3; 338/32 R
See application file for complete search history.

(56) References Cited

U.S. PATENT DOCUMENTS 5,491,410 A   2/1996  Nojima et al.
5,904,996 A   5/1999  Van Der Zaag et al.
6,104,275 A   8/2000  Maeda (Continued)

FOREIGN PATENT DOCUMENTS

| EP | 0 789 250 A2 | 8/1997 |
| JP | 11-87804 A | 3/1999 |
| JP | 22-274599 A | 10/1999 |
| JP | 2003-315091 A | 11/2003 |

OTHER PUBLICATIONS

Yutaka Yoshida et al., "Planar Contact, Yoke GMR Head vs. Conventional Flying, Shielded GMR Head: A Comparative Study," *IEEE Transactions on Magnetics*, vol. 34, No. 4, (Jul. 1998).

*Primary Examiner*—Edward Lefkowitz
*Assistant Examiner*—Kenneth J. Whittington
(74) *Attorney, Agent, or Firm*—Frishauf, Holtz, Goodman & Chick, P.C.

(57) ABSTRACT

A method of manufacturing a thin film magnetic sensor comprising: forming a projection on a surface of an insulating substrate formed of an insulating nonmagnetic material by removing an unnecessary portion of the insulating substrate from a surface region thereof or by depositing a thin film formed of an insulating nonmagnetic material on the surface of the insulating substrate; forming a pair of thin film yokes positioned to face each other with the projection interposed therebetween and completely electrically separated from each other, the thin film yokes being formed by depositing a thin film formed of a soft magnetic material on the surface of the insulating substrate having the projection formed thereon, followed by partially removing the thin film formed of the soft magnetic material until at least a tip surface of the projection is exposed to the outside; and depositing a GMR film having an electrical resistivity higher than that of the soft magnetic material on the tip surface of the projection and on upper surfaces of the thin film yokes contiguous to the projection such that the GMR film is electrically connected to the upper surfaces of the thin film yokes.

6 Claims, 16 Drawing Sheets

U.S. PATENT DOCUMENTS 6,501,268 B1 12/2002 Edelstein et al.
6,642,714 B2 11/2003 Kobayashi et al.
6,944,939 B2 9/2005 Guo et al.
6,995,960 B2 * 2/2006 Seyama et al. ........ 360/324.11
2004/0239320 A1 12/2004 Kobayashi et al.

* cited by examiner

METHODS FOR MANUFACTURING A THIN FILM MAGNETIC SENSOR

CROSS-REFERENCE TO RELATED APPLICATIONS

This is a Divisional application of application Ser. No. 10/853,619 filed May 24, 2004.

BACKGROUND OF THE INVENTION

1. Field of the Invention

The present invention relates to a thin film magnetic sensor and a method of manufacturing the same, and particularly to a thin film magnetic sensor suitable for detection of information on the rotation of an axle of a car, a rotary encoder, and an industrial gear, etc., suitable for detection of information on the stroke position of a hydraulic cylinder or an air type cylinder, and on the position and speed of a slide of a machine tool, suitable for detection of information on the arc current of the industrial welding robot, and suitable for use in a geomagnetism direction sensor, and to a method of manufacturing the particular thin film magnetic sensor.

2. Description of the Related Art

A magnetic sensor is an electronic device for converting the detected value of an electromagnetic force such as current, voltage, an electric power, a magnetic field, or a magnetic flux, the detected value of a dynamic quantity such as a position, speed, acceleration, displacement, distance, tension, pressure, torque, temperature, or humidity, and the detected value of the biochemical quantity, into voltage via a magnetic field. A magnetic sensor is classified into, for example, a hole sensor, an anisotropic magnetoresistance (AMR) sensor, and a giant magnetoresistance (GMR) sensor in accordance with the detecting method of a magnetic field.

Among the magnetic sensors noted above, the GMR sensor is advantageous in that:

(1) The GMR sensor has the maximum value in the rate of change of the electrical resistivity, i.e., MR ratio given below, which is markedly larger than that of any of the hole sensor and the AMR sensor:

MR ratio=$\Delta\rho/\rho_o$, where $\Delta\rho=\rho_H-\rho_o$, in which $\rho_H$ denotes the electrical resistivity under the external magnetic field H, and $\rho_o$ denotes the electrical resistivity under the condition that the external magnetic field is zero.

(2) The GMR sensor has a change with temperature in the resistance value, which is smaller than that of the hole sensor.

(3) Since the material producing the giant magnetoresistance effect is a thin film material the GMR sensor is suitable for miniaturization of the magnetic sensor.

Such being the situation, it is expected for the GMR sensor to be used as a high sensitivity micro magnetic sensor in a computer, a power generator, a car, a household electrical appliance, and a portable device.

The materials that are known to exhibit the GMR effect include, for example, (1) a metallic artificial lattice, which is a multilayer film including a ferromagnetic layer such as a layer of Permalloy and a nonmagnetic layer such as a layer of Cu, Ag, or Au, or a multilayer film having a four layer structure, which called a spin valve, the spin valve including an antiferromagnetic layer, a ferromagnetic layer (pinned layer), a nonmagnetic layer, and a ferromagnetic layer (free layer), (2) a metal-metal system nano granular material provided with particulates of a nanometer size formed of a ferromagnetic metal such as Permalloy and with a intergranule consisting of a nonmagnetic metal such as Cu, Ag, or Au, (3) a tunnel junction film that is allowed to exhibit the MR effect by the spin-dependent tunneling effect, and (4) a metal-insulator system nano granular material provided with particulates of a nanometer size formed of an alloy of a ferromagnetic metal and with a intergranule consisting of a nonmagnetic and insulating material.

Among the materials producing the GMR effect pointed out above, the multilayer film represented by the spin valve is featured in its high sensitivity under a low magnetic field. However, for preparing the multilayer film, it is necessary to laminate thin films made of various materials at a high precision, leading to a poor stability and a low manufacturing yield of the multilayer film. Such being the situation, reduction of the manufacturing cost is limited. Under the circumstances, the multilayer film of this kind is used exclusively in a high value-added device such as a magnetic head for a hard disk. It is considered difficult to use the particular multilayer film in a magnetic sensor that is forced to make competition in price with, for example, the AMR sensor or the hole sensor having a low unit price. It should also be noted that diffusion tends to be generated among the layers forming the multilayer film, and the GMR effect tends to disappear, with the result that the multilayer film is poor in its heat resistance.

On the other hand, the nano granular material can be manufactured easily and has a high reproducibility in general. Therefore, the manufacturing cost of the magnetic sensor can be lowered when the nano granular material is used for the manufacture of the magnetic sensor. Particularly, the metal-insulator system nano granular material is advantageous in that (1) if the composition is optimized, the metal-insulator system nano granular material is allowed to exhibit a high MR ratio exceeding 10% under room temperature, (2) since the metal-insulator system nano granular material exhibits an extremely high electrical resistivity, it is possible to miniaturize markedly the magnetic sensor and to save the power consumption of the magnetic sensor, and (3) the metal-insulator system nano granular material can be used even under a high temperature environment unlike the spin valve films comprising an antiferromagnetic film that is poor in its heat resistance. However, the metal-insulator system nano granular material is defective in that the sensitivity to the magnetic field is very low under a low magnetic field.

A measure for overcoming the problems pointed out above is disclosed in Japanese Patent Disclosure (Kokai) No. 11-087804. Specifically, it is disclosed that soft magnetic thin films are arranged on both sides of a giant magnetoresistance effect thin film in order to increase the sensitivity of the giant magnetoresistance effect thin film to the magnetic field. Also disclosed in the patent document quoted above is a method of manufacturing a thin film magnetic sensor, comprising the steps of forming a permalloy thin film (soft magnetic film) in a thickness of 2 μm on a substrate, forming a gap having a width of about 9 μm in the permalloy thin film by using an ion beam etching apparatus, and forming a nano granular GMR film having a composition of $Co_{38.6}Y_{14.0}O_{47.4}$ in the gap portion.

Japanese Patent Disclosure No. 11-274599 is also directed to a thin film magnetoresistance element in which soft magnetic thin films are arranged on both sides of a giant magnetoresistance thin film. It is taught that, in order to further improve the sensitivity of the magnetoresistance element to the magnetic field, the giant magnetoresistance thin film is made thinner than the soft magnetic thin film.

A soft magnetic material having a large saturation magnetization and a high magnetic permeability has a very high sensitivity to the magnetic field and exhibits a very large magnetization under a relatively weak external magnetic field. Therefore, when an external magnetic field is allowed to act on a thin film magnetic sensor constructed such that a thin film having a high electrical resistivity and producing a giant magnetoresistance effect (GMR film) is arranged in a small gap formed between thin film yokes formed of a soft magnetic material such that the GMR film is electrically connected to the thin film yokes, the thin film yokes are magnetized by a weak external magnetic field, and a magnetic field having an intensity 100 to 10,000 times as high as that of the external magnetic field is exerted on the GMR film. As a result, it is possible to markedly increase the sensitivity of the GMR film to the magnetic field. Incidentally, a metal-insulator system nano granular thin film is known nowadays as the GMR film.

FIG. 1 is a plan view schematically showing the construction of a conventional thin film magnetic sensor 10, and FIG. 2 is a cross sectional view along the line II—II shown in FIG. 1. As shown in FIGS. 1 and 2, the conventional thin film magnetic sensor 10 comprises an insulating substrate 12 made of an insulating and nonmagnetic material, a pair of thin film yokes 14 each formed of a soft magnetic material, the thin film yokes 14 being arranged to face each other with a gap 14a formed therebetween, a GMR film 16 formed within the gap 14a, electrodes 18, 18 formed at the edge portions of the thin film yokes 14, and a protective film 19 for protecting the thin film yokes 14 and the GMR film 16.

The conventional thin film magnetic sensor 10 of the construction described above is formed by the method comprising the steps of forming the pair of the thin film yokes 14 arranged to face each other with the gap 14a (concave groove) interposed therebetween by removing the unnecessary portion of the soft magnetic thin film formed on the surface of the insulating substrate 12, and depositing the GMR film 16 with a mask formed to cover the insulating substrate 12 except the regions in the vicinity of the gap 14a.

However, the thin film magnetic sensor 10 manufactured by the method described above gives rise to the problem that the electrical characteristics and the magnetic characteristics of the sensor 10 greatly varies. The difficulty is brought about by the situation that, in the conventional manufacturing method described above, for example, the electrical contact between the thin film yokes 14 and the GMR film 16 is rendered insufficient, or the thickness of the GMR film 16 is made nonuniform within the gap 14a, with the result that the manufactured sensor 10 is rendered unstable.

FIG. 3 shows the difficulty accompanying the conventional method of manufacturing the thin film magnetic sensor. To be more specific, if the GMR film 16 is deposited from above the thin film yokes 14 positioned to face each other with the small gap 14a interposed therebetween, the thickness in the side wall portions 16c of the GMR film 16, which are formed on the side walls of the thin film yokes 14 having a large height, is gradually increased in accordance with increase in the thickness of the upper portions 16a of the GMR film 16 deposited on the upper surfaces of the thin film yokes 14, as shown in FIG. 3. As a result, the corner portions at the bottom of the gap 14a are shaded by the side wall portions 16c of the GMR film 16 deposited on the side walls of the thin film yokes 14. It follows that the deposition of the GMR film 16 is inhibited at the corner portions in the bottom portion 16b of the GMR film 16, which is deposited on the bottom surface of the gap 14a. Such being the situation, the bottom portion 16b of the GMR film 16 is rendered triangular or trapezoid in its cross sectional shape so as to cause the contact electrical resistance between the bottom portion 16b of the GMR film 16 and the thin film yokes 14 to greatly vary. Particularly, this undesirable phenomenon is rendered prominent in the high performance type thin film magnetic sensor in which the thin film yokes have a large height and the gap between the paired thin film yokes is small. In the worst case, the electrical resistance is rendered infinitely high so as to give rise to a serious obstacle that must be eliminated for putting the thin film magnetic sensor to the practical use.

BRIEF SUMMARY OF THE INVENTION

An object of the present invention is to provide a thin film magnetic sensor comprising a GMR film having a high electrical resistivity and thin film yokes arranged on both sides of the GMR film and formed of a soft magnetic material so as to permit the thin film yokes to be electrically connected to the GMR film, the thin film magnetic sensor being capable of suppressing the variation in the electrical contact state between the GMR film and the thin film yokes, the GMR film having a uniform thickness, the thin film magnetic sensor exhibiting stable magnetic characteristics, and a method of manufacturing the particular thin film magnetic sensor.

According to a first aspect of the present invention, there is provided a thin film magnetic sensor, comprising:

a pair of thin film yokes each formed of a soft magnetic material, the thin film yokes being arranged to face each other with a gap interposed therebetween;

a GMR film electrically connected to the pair of the thin film yokes and having an electrical resistivity higher than that of the soft magnetic material; and an insulating substrate supporting the thin film yokes and the GMR film and formed of an insulating nonmagnetic material;

wherein a gap column of a multilayer structure including a layer formed of an insulating nonmagnetic material and a layer of the GMR film is arranged within the gap, and the thickness of the GMR film is uniform over the gap length.

According to a second aspect of the present invention, there is provided a method of manufacturing a thin film magnetic sensor, comprising the steps of:

forming a projection on a surface of an insulating substrate formed of an insulating nonmagnetic material by removing the unnecessary portion of the insulating substrate from a surface region thereof or by depositing a thin film formed of an insulating nonmagnetic material on the surface of the insulating substrate;

forming a pair of thin film yokes positioned to face each other with the projection interposed therebetween and electrically separated from each other completely, the thin film yokes being formed by depositing a thin film formed of a soft magnetic material on the surface of the insulating substrate having the projection formed thereon, followed by partially removing the thin film formed of the soft magnetic material until at least the tip surface of the projection is exposed to the outside; and depositing a GMR film having an electrical resistivity higher than that of the soft magnetic material on the tip surface of the projection and on the upper surfaces of the thin film yokes contiguous to the projection such that the GMR film is electrically connected to the upper surfaces of the thin film yokes.

According to a third aspect of the present invention, there is provided a method of manufacturing a thin film magnetic sensor, comprising the steps of:

depositing a GMR film on a surface of an insulating substrate formed of an insulating nonmagnetic material;

forming a projection by depositing a thin film formed of an insulating nonmagnetic material on the GMR film, followed by entirely removing the thin film formed of the insulating nonmagnetic material and removing partly or entirely the GMR film, with the region forming the projection left unremoved, until the GMR film is exposed partly or entirely to at least a side wall surface of the projection; and forming a pair of thin film yokes positioned to face each other with the projection interposed therebetween and electrically connected to the GMR film alone, the thin film yokes being formed by depositing a thin film formed of a soft magnetic material having an electrical resistivity lower than that of the GMR film on the surface of the insulating substrate having the projection formed thereon such that the deposited thin film is electrically connected to the GMR film exposed in advance to the side wall surface of the projection, followed by partially removing the thin film formed of the soft magnetic material until at least a tip surface of the projection is exposed to the outside.

According to a fourth aspect of the present invention, there is provided a method of manufacturing a thin film magnetic sensor, comprising the steps of:

depositing a GMR film on a surface of an insulating substrate formed of an insulating nonmagnetic material;

forming a projection by depositing a thin film formed of an insulating nonmagnetic material on the GMR film, followed by partially removing the thin film formed of the insulating nonmagnetic material, with a region forming the projection left unremoved, until a surface of at least the GMR film is exposed to the outside; and forming a pair of thin film yokes positioned to face each other with the projection interposed therebetween and connected electrically to the GMR film alone, the thin film yokes being formed by depositing a thin film formed of a soft magnetic material having an electrical resistivity lower than that of the GMR film on the surface of the insulating substrate having the projection formed thereon such that the deposited thin film is electrically connected to the GMR film exposed in advance to the outside, followed by partially removing the thin film formed of the soft magnetic material until at least a tip surface of the projection is exposed to the outside.

According to the first aspect of the present invention, a gap column of a multilayer structure comprising a layer of an insulating nonmagnetic material and a layer of the GMR film is arranged in the gap between the thin film yokes each of the soft magnetic material. Since the thickness of the GMR film is uniform over the gap length, it is possible to connect electrically the GMR film to the thin film yokes without fail. It follows that the electrical characteristics and the magnetic characteristics of the thin film magnetic sensor are rendered highly stable because of a precise electrical resistivity.

According to the second aspect of the present invention, the thin film yokes are formed on both sides of a projection formed on the surface of the insulating substrate, followed by forming a GMR film on the plane including the tip surface of the projection and the upper surfaces of the thin film yokes. It follows that it is unnecessary to carry out the step of depositing a GMR film within a small gap formed between the thin film yokes each having a large height so as to make it possible to obtain a GMR film having a uniform thickness over at least the gap length. In addition, since a metallic face contact can be achieved without fail between the GMR film and the thin film yokes, the electric and magnetic characteristics of the thin film magnetic sensor are stabilized.

Further, according to the third and fourth aspects of the present invention, a GMR film and a thin film of an insulating nonmagnetic material are formed in advance on the surface of an insulating substrate, followed by forming a projection in a manner to permit the GMR film to be exposed to the outside on the side wall surface or in the vicinity of the bottom surface of the projection. It follows that it is unnecessary to carry out the step of forming a GMR film within a small gap formed between the thin film yokes each having a large height so as to make it possible to obtain a GMR film having a uniform thickness over at least the gap length. Also, if the thin film yokes are formed on both sides of the projection, a face contact can be achieved without fail between the GMR film and the thin film yokes so as to stabilize the electric and magnetic characteristics of the thin film magnetic sensor.

DETAILED DESCRIPTION OF THE INVENTION

Some embodiments of the present invention will now be described in detail with reference to the accompanying drawings.

First Embodiment

A first embodiment of the present invention will now be described first.

Figure 4:
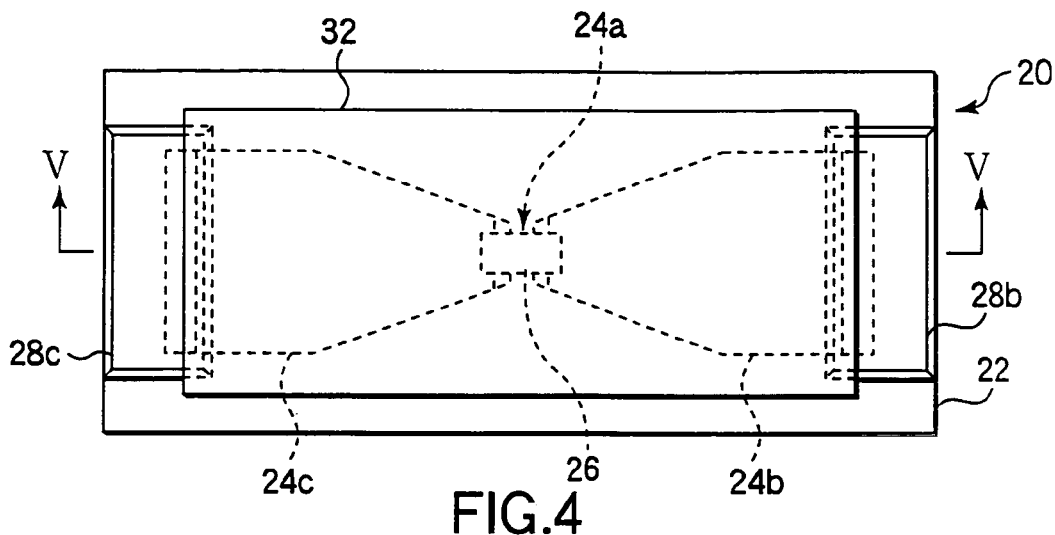
FIG. 4 is a plan view schematically showing the construction of a thin film magnetic sensor according to a first embodiment of the present invention.
Figure 5:
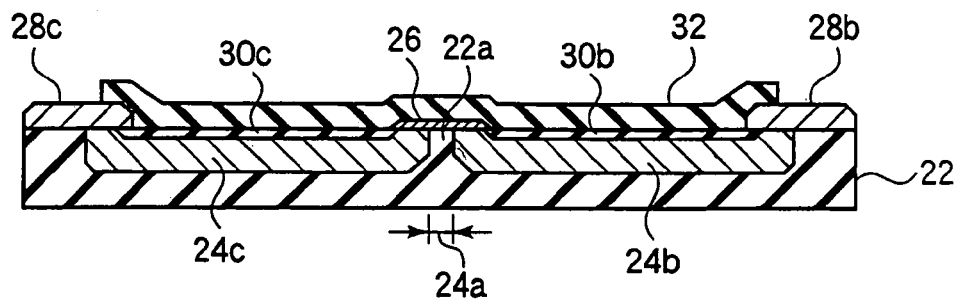
FIG. 5 is a cross sectional view along the line V—V shown in FIG. 4.
Figure 6:
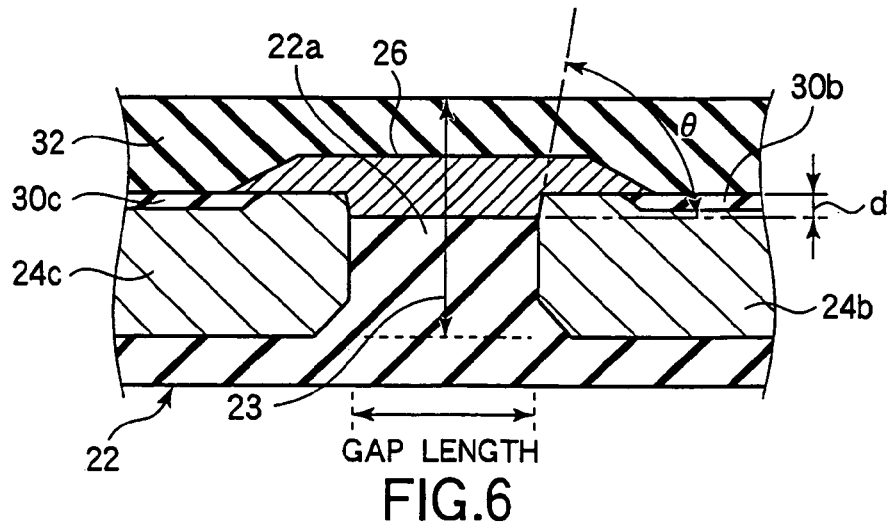
FIG. 6 is a cross sectional view showing in a magnified fashion the region in the vicinity of the gap included in the thin film magnetic sensor according to the first embodiment of the present invention.

FIG. 4 is a plan view schematically showing the construction of a thin film magnetic sensor 20 according to a first embodiment of the present invention, FIG. 5 is a cross sectional view along the line V—V shown in FIG. 4, and FIG. 6 is a cross sectional view showing in a magnified fashion the region in the vicinity of the gap included in the thin film magnetic sensor according to the first embodiment of the present invention.

As shown in the drawings, the thin film magnetic sensor 20 according to the first embodiment of the present invention comprises an insulating substrate 22, a pair of thin film yokes 24b, 24c, and a GMR film 26. The thin film yokes 24b and 24c are arranged to face each other with a gap 24a interposed therebetween. Also, the GMR film 26 is formed in the gap 24a in a manner to permit the GMR film 26 to be electrically connected to the thin film yokes 24b, 24c. Electrodes 28b, 28c are formed in the edge portions of the thin film-yokes 24b, 24c, respectively. Also, first protective films 30b, 30c are formed on the upper surfaces of the thin film yokes 24b, 24c, respectively. Further, the uppermost surface of the insulating substrate 22 is covered with a second protective film 32.

The insulating substrate 22, which serves to support the first and second thin film yokes 24b, 24c and the GMR film 26, is formed of an insulating nonmagnetic material. To be more specific, the insulating substrate 22 is formed of a high rigidity material, for example, a glass, an alumina, a silicon covered with a thermally-oxidized film, and an alumina titanium carbide, which have flattened surface with a insulating film.

Figure 7A:
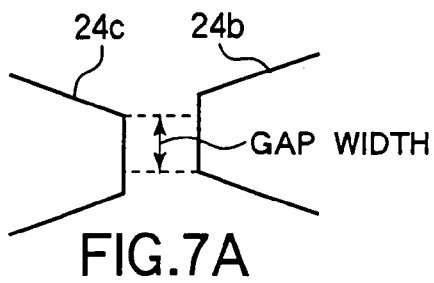
FIGS. 7A and 7B are plan views showing in a magnified fashion the region in the vicinity of the gap included in the thin film magnetic sensor according to the first embodiment of the present invention.
Figure 7B:
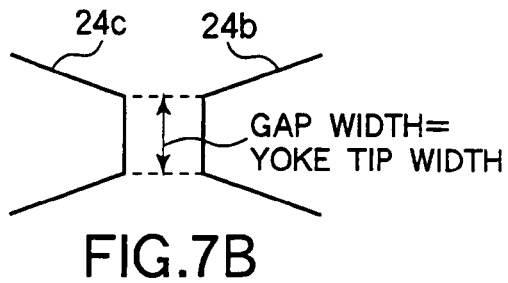

A gap column 23 is formed in a gap 24a formed in an optional portion on the surface of the insulating substrate 22 so as to separate the thin film yokes 24b and 24c, which are positioned to face each, from each other. The term "gap column" denotes a multilayer structure layered within the gap 24a formed between the thin film yokes 24b and 24c positioned to face each other and including an insulating nonmagnetic layer and the GMR film 26. To be more specific, the gap column 23 extends upward from the lowest plane of the surface of the insulating substrate 22. In the first embodiment of the present invention, the gap column 23 is formed of a multilayer structure comprising a projection 22a formed on the surface of the insulating substrate 22, and a layered structure deposited on the projection 22a and including the GMR film 26 and the second protective film 32. Also, in the first embodiment of the present invention, the gap length, i.e., the length of the gap 24a, denotes the distance between the thin film yokes 24b and 24c, which is the shortest distance of the region in which the thin film yokes 24b and 24c are brought into contact with the GMR film 26. Also, the term "gap width" denotes the length in a direction perpendicular to the direction of the gap length of the region sandwiched between the tips of the thin film yokes 24b and 24c which are positioned to face each other, as shown in FIG. 7A. Incidentally, if the thin film yokes 24b and 24c, which are positioned to face each other, are arranged in symmetry, the gap width coincides with the width of the thin film yoke 24 at the tip, as shown in FIG. 7B.

It is desirable for the cross section of the projection 22a constituting the gap column 23 to include a parallel portion extending over a prescribed distance on the side of the upper surfaces of at least the thin film yokes 24b, 24c. It is possible for the proximal end portion of the projection 22a to be tapered as shown in FIG. 5. Alternatively, it is possible for the entire region of the projection 22a to have a columnar shape.

The method of forming the projection 22a is not particularly limited. For example, the projection 22a can be formed by partially removing by way of, for example, the etching the unnecessary portion of a flat surface region of the insulating substrate 22, as described herein later. Alternatively, the projection 22a can be formed by depositing a thin film of an insulating nonmagnetic material on a flat surface of the insulating substrate 22, followed by partially removing the unnecessary portion of the thin film.

The shapes in other portions of the insulating substrate 22 are not particularly limited. It is possible to select optimum shapes in accordance with the use and the required properties of the thin film magnetic sensor 20. Also, only one element comprising the thin film yokes 24b, 24c and the GMR film 26, which is formed on the insulating substrate 22, is shown in each of FIGS. 4 to 6. However, these drawings are simply intended to exemplify the construction of the thin film magnetic sensor 20. In the case of the mass production of the thin film magnetic sensors 20, a plurality of elements are formed simultaneously on one insulating substrate 22.

In order to prevent the fluctuation of the standard potential caused by the temperature, the thin film magnetic sensor generally comprises two elements that are connected in series, and the external magnetic field is detected by measuring the midpoint potential. Also, the thin film magnetic sensor is classified into a perpendicular type in which the two elements are arranged such that the sensitive axes of these two elements are perpendicular to each other, and a parallel type in which the two elements are arranged such that the sensitive axes of these two elements are parallel to each other. Also, in order to double the output, a bridge circuit is formed in some cases by using four elements. In this case, it is possible to form only one element on the insulating substrate 22 and to prepare a magnetic sensor by combining a plurality of the elements each formed on the single insulating substrate 22. Alternatively, it is also possible to form a plurality of elements on the single insulating substrate 22 such that these plural elements are electrically connected to each other.

Each of the thin film yokes 24b and 24c, which are intended to increase the sensitivity of the GMR film 26 to the magnetic field, is formed of a soft magnetic material. In order to obtain a high sensitivity to the magnetic field under a weak magnetic field, it is desirable to use a material having a high magnetic permeability μ and/or a high saturation magnetization Ms for forming the thin film yokes 24b and 24c. To be more specific, it is desirable for the yoke-forming material to have a magnetic permeability μ not lower than 100, preferably not lower than 1,000. It is also desirable for the yoke-forming material to have a saturation magnetization Ms not lower than 5 kilo Gauss, preferably not lower than 10 kilo Gauss.

The specific materials preferably used for forming the thin film yokes 24b and 24c include, for example, permalloy (40 to 90% Ni—Fe alloy), Sendust ($Fe_{74}Si_9Al_{17}$), Hardperm ($Fe_{12}Ni_{82}Nb_6$), $Co_{88}Nb_6Zr_6$ amorphous alloy, $(Co_{94}Fe_6)_{70}Si_{15}B_{15}$ amorphous alloy, Finemet ($Fe_{75.6}Si_{13.2}B_{8.5}Nb_{1.9}Cu_{0.8}$), Nanomax ($Fe_{83}HF_6C_{11}$), $Fe_{85}Zr_{10}B_5$ alloy, $Fe_{93}Si_3N_4$ alloy, $Fe_{71}B_{11}N_{18}$ alloy, $Fe_{71.3}Nd_{9.6}O_{19.1}$ nano granular alloy, $Co_{70}Al_{10}O_{20}$ nano granular alloy, and $Co_{65}Fe_5Al_{10}O_{20}$ alloy.

The thin film yokes 24b and 24c are formed of the material deposited on both sides of the projection 22a formed on the surface of the insulating substrate 22. The shape of the thin film yokes 24b, 24c is not particularly limited. However, in order to increase the sensitivity of the GMR film 26 to the magnetic field, it is desirable for the thin film yokes 24b, 24c to satisfy the conditions described in the following.

First of all, it is desirable that the cross sectional area each of the thin film yokes 24b and 24c on the side of the gap 24a is smaller than that on the each side of the electrodes 28b and 28c each of which acts inflow edge or outflow edge of the external magnetic field. If the cross sectional area of the thin film yoke is made smaller on the side of the gap 24a, the magnetic flux density is increased at the tip of the gap 24a thereby permitting a stronger magnetic field to act on the GMR film 26.

What should also be noted is that it is desirable for each of the thin film yokes 24b and 24c to have an appropriately large L/W ratio, i.e., the ratio of the length L in the gap length direction to the width W on the side of the electrode. Since the demagnetizing field generated in the gap length direction is weakened as the length of each of the thin film yokes 24b and 24c is relatively increased in the gap length direction, it is possible to allow the facing surfaces of the thin film yokes 24b and 24c on the side of the electrodes 28b and 28c to perform effectively the function as the inflow and outflow edge of the external magnetic field.

Further, it is desirable for the thin film yokes 24b and 24c to be shaped in symmetry with respect to the gap 24a. It is undesirable for the thin film yokes 24b and 24c to be shaped in asymmetry because the characteristics of the thin film magnetic sensor 20 are governed by the thin film yoke having bad magnetic properties.

In addition, it is desirable for the shortest distance between the thin film yokes 24b and 24c, which are positioned to face each other in contact with the GMR film 26 with the gap 24a interposed therebetween, i.e., the gap length, to be short. With decrease in the gap length, the dispersion into the air atmosphere of the magnetic flux leaking from the tips of the thin film yokes 24b and 24c is suppressed more effectively so as to allow a stronger magnetic field to act on the GMR film 26. It should be noted, however, that the gap length should be determined appropriately in view of, for example, the magnitude of the magnetic field acting on the GMR film 26, the easiness of formation of the projection 22a, and the specification of the electrical resistance.

Incidentally, the thickness of each of the thin film yokes 24b and 24c is not particularly limited. It is possible to determine appropriately the thickness of the thin film yoke in accordance with, for example, the material of each of the thin film yokes 24b, 24c and the characteristics required for the thin film magnetic sensor 20. Also, in the example shown in FIG. 4, the planar shape of each of the thin film yokes 24b and 24c is tapered on the side of the tip (on the side of the gap 24a). However, it is also possible to form a parallel portion at the tip of each of the thin film yokes 24b and 24c. If a parallel portion is formed at the tip of each of the thin film yokes 24b and 24c, it is possible to suppress the dispersion of the magnetic flux at the tip of each of the thin film yokes 24b and 24c so as to allow a stronger magnetic field to act on the GMR film 26.

The GMR film 26 will now be described. The GMR film 26, which is sensitive to the change of the external magnetic field as the change of the electrical resistance thereby detecting the change of the external magnetic field as a change of the voltage, is formed of a material exhibiting giant magnetoresistance effect. In order to allow the GMR film 26 to detect the change of the external magnetic field with a high sensitivity, it is desirable for the GMR film 26 to have an absolute value of the MR ratio not smaller than 5%, preferably not smaller than 10%, under the condition that the external magnetic field H is not higher than several ten thousand oersteds (Oe).

Also, in the present invention, the GMR film 26 is directly connected electrically to the thin film yokes 24b and 24c. Therefore, a material having an electrical resistivity higher than that of the thin film yokes 24b and 24c is used for forming the GMR film 26. It is undesirable to use a material having an excessively low electrical resistivity for forming the GMR film 26 because, in this case, an electrical short circuit is formed in general between the thin film yokes 24b and 24c. On the other hand, in the case of using a material having an excessively high electrical resistance for forming the GMR film 26, a noise is increased so as to make it difficult to detect the change of the external magnetic field as the change of voltage. It is desirable for the GMR film 26 to exhibit an electrical resistivity falling within a range of between $10^3$ μΩcm and $10^{12}$ μΩcm, preferably between $10^4$ μΩcm and $10^{11}$ μΩcm.

The condition given above can be satisfied by various materials. Particularly, the metal-insulator system nano granular material can be used suitably for forming the GMR film 26. In the metal-insulator system nano granular material which exhibits a high MR ratio and a high electrical resistivity, the MR ratio is not greatly changed by a slight change in the composition. It follows that the metal-insulator system nano granular material is advantageous in that it is possible to manufacture a thin film having stable magnetic characteristics with a high reproducibility at a low cost.

The metal-insulator system nano granular materials producing a giant magnetoresistance effect and used for forming the GMR film 26 include, for example, Co—Y$_2$O$_3$ system nano granular alloy, Co—Al$_2$O$_3$ system nano granular alloy, Co—Sm$_2$O$_3$ system nano granular alloy, Co—Dy$_2$O$_3$ system nano granular alloy, FeCo—Y$_2$O$_3$ system nano granular alloy, and fluoride system nano granular alloys such as Fe—MgF$_2$, FeCo—MgF$_2$ and Fe—CaF$_2$.

The thin film magnetic sensor according to the first embodiment of the present invention differs from the conventional thin film magnetic sensor in that the GMR film 26 is formed on a surface (hereinafter referred to as a "GMR film-forming surface") consist of the tip surface of the projection 22a made of an insulating nonmagnetic material and the upper surfaces of the thin film yokes 24b, 24c deposited on both sides of the projection 22a.

The GMR film-forming surface can be formed by the steps of (1) forming the projection 22a on the surface of the insulating substrate 22, (2) depositing the thin film yokes 24b and 24c each of a soft magnetic material on both sides of the projection 22a, and (3) partially removing the thin film yokes 24b, 24c formed of the soft magnetic material by, for example, polishing or etching until at least the tip surface of the projection 22a is exposed to the outside.

It is not absolutely necessary for the GMR film-forming surface not to include a stepped region. It is possible for the GMR film-forming surface to include a slightly stepped region. If the unnecessary portions of the projection 22a and the thin film yokes 24b, 24c, which differ from each other in the material, are partially removed simultaneously as in the first embodiment of the present invention, it is possible for the difference in the polishing rate or the etching rate between the material of the projection 22a and the material of the thin film yokes 24b, 24c to cause a step "d" to be formed between the tip surface of the projection 22a and the upper surfaces of the thin film yokes 24b, 24c, as shown in FIG. 6.

In order to permit a sound GMR film 26 to be deposited on the GMR film-forming surface and to stabilize the state of the electrical contact between the GMR film 26 and the thin film yokes 24b, 24c, it is desirable for the step "d" on the GMR film-forming surface in the direction of the gap length to be not larger than at least the thickness of the GMR film 26, more preferably to be not larger than ½ of the thickness of the GMR film 26. The step "d" on the GMR film-forming surface should be as small as possible.

Where a small step is formed on the GMR film-forming surface, it is desirable for the inclination angle θ of the side wall of the step in the direction of the gap length, i.e., the inclination angle θ of the edge surfaces of the thin film yokes 24b, 24c in FIGS. 4 to 6, to be as small as possible. With increase in the inclination angle θ of the side wall of the step, the shading is formed by the side wall of the step on the GMR film-forming surface, with the result that the deposition of the GMR film 26 is inhibited in the shaded portion. Such being the situation, the inclination angle θ noted above should be as small as possible.

In order to permit a sound GMR film 26 to be deposited on the GMR film-forming surface, it is desirable for the inclination angle θ of the side wall of the step to be not larger than 80° relative to the horizontal plane, more preferably not larger than 60° relative to the horizontal plane. Incidentally, in the case where the removing treatment such as an etching is applied simultaneously to the projection 22a and the thin film yokes 24b, 24c, it is possible to set the inclination angle θ of the side wall of the step relative to the horizontal plane at 80° or less by optimizing the conditions of the removing treatment.

Further, it is necessary for the length of the GMR film-forming surface in the gap length direction to be equal to or larger than the gap length. On the other hand, it is possible for the length of the GMR film-forming surface in its width direction, i.e., the length in a direction perpendicular to the gap length direction, to be larger or smaller than the gap width. It should be noted, however, that it is necessary for the length of the GMR film-forming surface in its width direction to be larger than the lateral width of the GMR film 26.

Also, in order to improve the sensitivity of the GMR film 26 to the magnetic field, it is desirable for the shape of the GMR film 26 deposited on the GMR film-forming surface to satisfy the conditions described in the following.

First of all, it is desirable for the lateral width of the GMR film 26 to be smaller than the gap width. It is undesirable for the GMR film 26 to have a large lateral width because, if the lateral width of the GMR film 26 is increased, that region of the GMR film 26 which is sensitive to the weak magnetic flux leaking from the thin film yokes 24b, 24c in the direction of the lateral width is increased so as to lower the sensitivity of the GMR film 26 to the magnetic field. It should be noted, however, that it is acceptable for the lateral width of the GMR film 26 to be increased to a level about 1.1 times as much as the gap width.

It is also desirable for the thickness of the GMR film 26 to be larger than the step "d" between the tip surface of the projection 22a and the upper surfaces of the thin film yokes 24b and 24c. Incidentally, the thickness of the GMR film 26 can be determined in accordance with the specification of the electrical resistance of the thin film magnetic sensor.

Incidentally, in the first embodiment of the present invention, the length of the GMR film 26 in the direction of the gap length is not particularly limited. The length of the GMR film 26 in the direction of the gap length may be markedly larger than the gap length. It should be noted in this connection that the electric current supplied into the electrodes 28b, 28c of the thin film magnetic sensor 20 flows mainly into only that region of the GMR film 26 which is positioned within the gap 24a having the lowest electrical resistance, and only a very small current alone flows into the other region. Such being the situation, it is possible for the length of the GMR film 26 in the direction of the gap length to be markedly larger than the gap length as pointed out above.

Each of the electrodes 28b and 28c, which serves to take out the output, is formed of a conductive material. To be more specific, it is desirable to use, for example, Cu, Ag or Au for forming the electrodes 28b and 28c. It should be noted, however, that an underlayer formed of, for example, Cr, Ti or Ni is formed below the electrode for improving the bonding strength of the electrode and for preventing the diffusion. The shapes of the electrodes 28b and 28c are not particularly limited. It is possible to select an appropriate shape in accordance with, for example, the size of the thin film magnetic sensor 20 and the shapes of the thin film yokes 24b and 24c.

The first protective films 30b and 30c serve to protect the thin film yokes 24b and 24c in the step of exposing the projection 22a to the outside after deposition of the thin film yokes 24b and 24c on both sides of the projection 22a. It follows that the first protective films 30b, 30c, which are required in the removing process, are not absolutely required in the thin film magnetic sensor 20. On the other hand, the second protective film 32 serves to shield the GMR film 26 and the thin film yokes 24b, 24c exposed to the surface of the insulating substrate 22 from the air atmosphere so as to protect the GMR film 26, etc. noted above.

An insulating nonmagnetic material is used for forming each of the first protective films 30b, 30c and the second protective film 32. To be more specific, a material selected from the group consisting of $Al_2O_3$, $SiO_2$, $Si_3N_4$ and photoresist hard-baked under temperatures not lower than 200° C. is used for forming the first protective films 30b, 30c and the second protective film 32.

The manufacturing process of the thin film magnetic sensor 20 according to the first embodiment of the present invention will now be described.

Figure 8A:
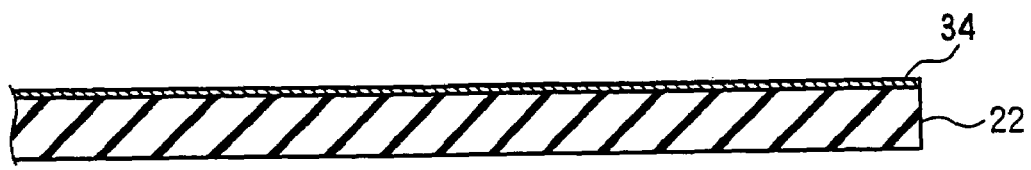
FIGS. 8A to 8Q are cross sectional views collectively showing the manufacturing process of the thin film magnetic sensor according to the first embodiment of the present invention.
Figure 8B:
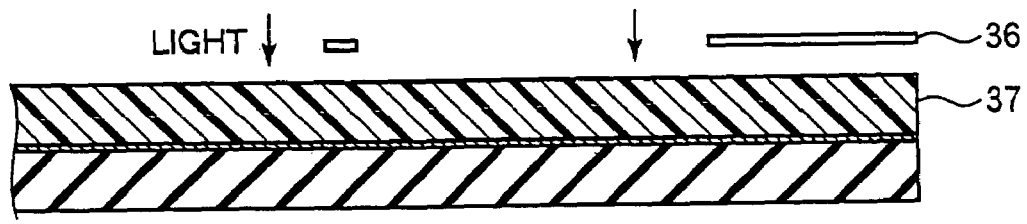
Figure 8C:
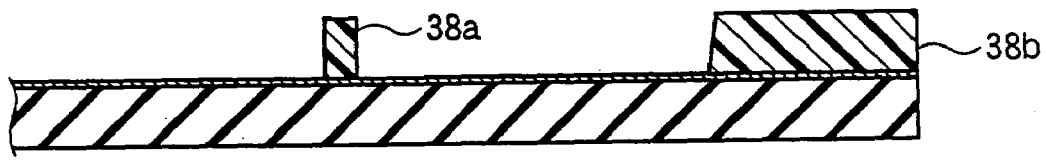
Figure 8D:
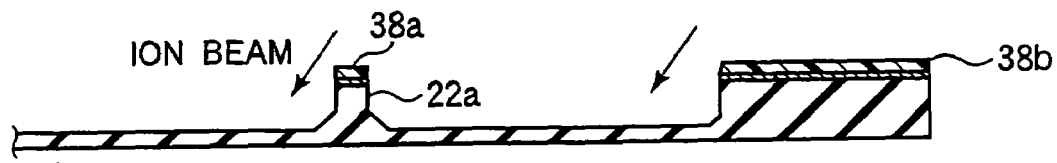
Figure 8E:
Figure 8F:
Figure 8G:
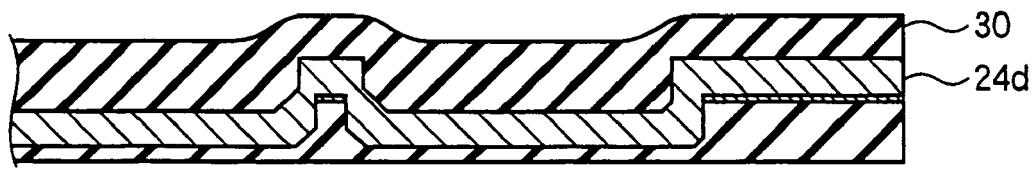
Figure 8H:
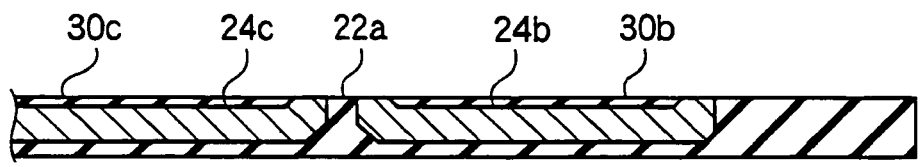
Figure 8I:
Figure 8J:
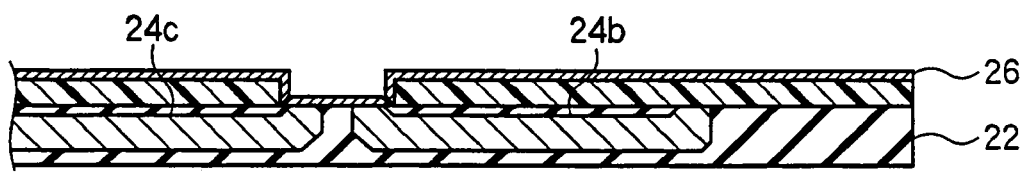
Figure 8K:
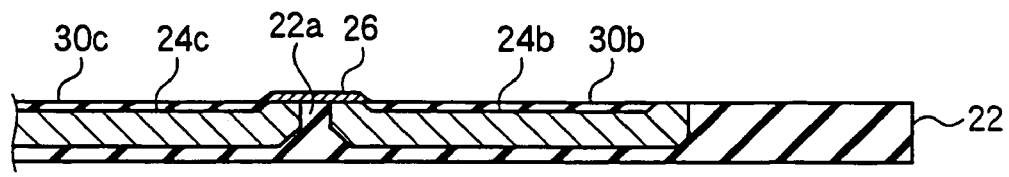
Figure 8L:
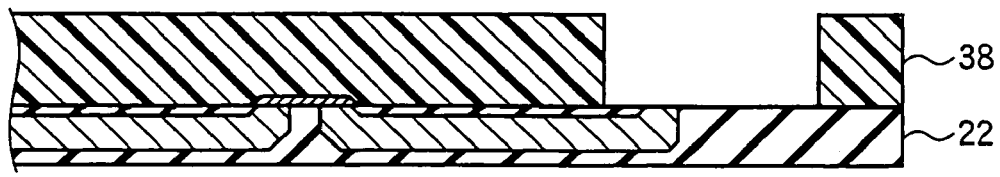
Figure 8M:
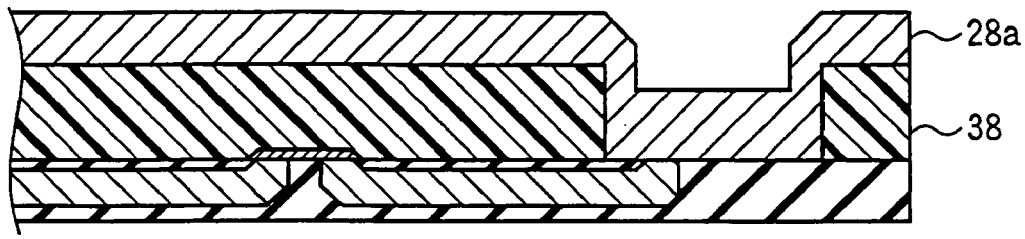
Figure 8N:
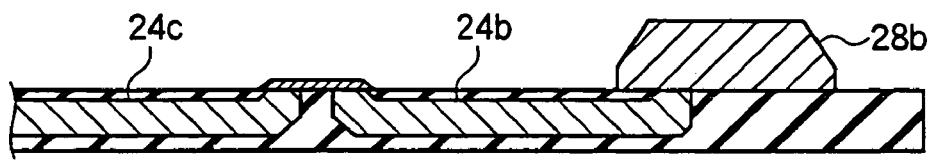
Figure 8O:
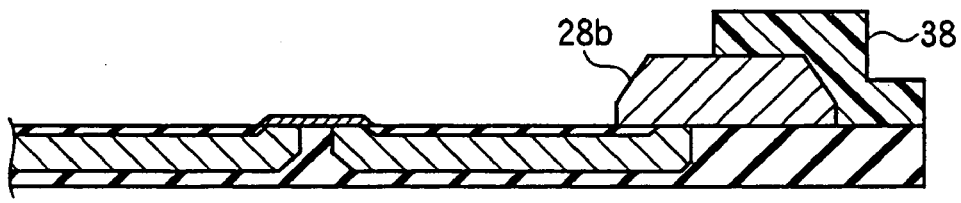
Figure 8P:
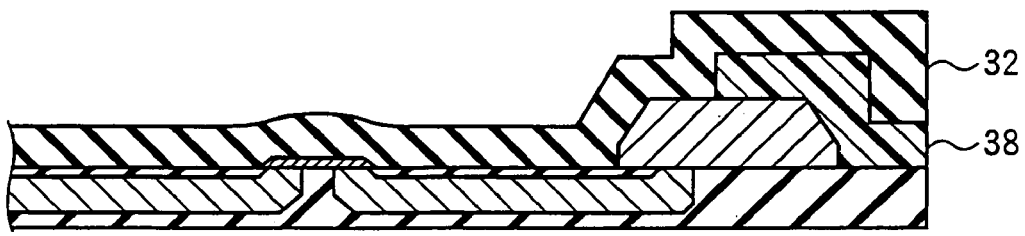
Figure 8Q:
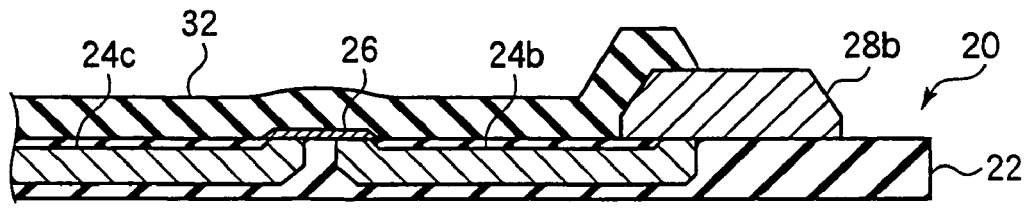

FIGS. 8A to 8Q are cross sectional views collectively showing the manufacturing process of the thin film magnetic sensor according to the first embodiment of the present invention. The manufacturing process for this embodiment comprises the step of forming a projection, the step of forming thin film yokes, the step of forming a GMR film, the step of forming electrodes, and the step of forming a surface protective film.

The step of forming a projection will now be described first. The projection 22a consisting of an insulating nonmagnetic material is formed on the surface of the insulating substrate 22 in the step of forming the projection. To be more specific, it is desirable for the step of forming the projection to be carried out as follows.

In the first step, a penetration preventing film 34 is formed on the surface of the insulating substrate 22, as shown in FIG. 8A. The penetration preventing film 34 serves to enhance the pattern accuracy in the patterning step with photoresist, which is described herein later. In general, the penetration preventing film 34 is formed of, for example, a Cr thin film or a Ti thin film.

In the next step, the penetration preventing film 34 is coated with photoresist 37, followed by arranging a mask 36 having a prescribed open portion above the insulating substrate 22, as shown in FIG. 8B, followed by exposing to light. Then, the sensitized portion is removed by the development so as to form a photoresist film 38a in the portion forming the projection 22a and a photoresist film 38b in the portion where the thin film yokes 24b, 24c are not formed, as shown in FIG. 8C.

In this case, it is desirable to carry out a post baking at 80 to 120° C. for 0.05 to 1 hour after formation of the photoresist films 38a, 38b. If the post baking is applied, the solvent is evaporated from the photoresist film 38b so as to permit the photoresist film 38b to be shrunk to some extent, with the result that a gradient is imparted to the side surface of the photoresist film 38b. If the side surface of the photoresist film 38b is slightly inclined, the shading is unlikely to be generated in the subsequent etching step of the insulating substrate 22 and, thus, the etching can be performed efficiently. Also, if the etching condition is optimized, it is possible to etch the insulating substrate 22 along the boundary line of the photoresist film 38b in a direction substantially perpendicular to the surface of the insulating substrate 22. Incidentally, the photoresist film 38a formed in the portion of the projection 22a has a small volume and, thus, even if a post baking is applied to the photoresist film 38a, the shape of the photoresist film 38a in the stage of the development is held substantially unchanged. In other words, the side surface of the photoresist film 38a is held substantially perpendicular to the upper surface of the insulating substrate 22.

In the next step, an Ar ion beam etching is performed while rotating the insulating substrate 22, as shown in FIG. 8D. In this stage, it is possible to etch the surface region of the insulating substrate 22 in a direction substantially perpendicular to the upper surface of the insulating substrate 22 along the boundary lines of the photoresist films 38a and 38b as shown in the drawing, if the irradiating conditions such as the rotating speed of the insulating substrate 22 and the irradiating angle of the Ar ion beam are optimized. Particularly, in the case of applying the post baking, the depth of the perpendicular portion of the insulating substrate 22 which is formed by etching along the boundary line of the photoresist film 38b can be made larger than the depth on the side of the photoresist film 38a.

After completion of the Ar ion beam etching, the photoresist films 38a and 38b remaining on the surface of the insulating substrate 22 are removed (peeled off) so as to form the projection 22a on the surface of the insulating substrate 22, as shown in FIG. 8E. It should be noted that the side wall of the projection 22a is substantially perpendicular to the upper surface of the insulating substrate 22, and the projection 22a has a prescribed width (gap length) and a prescribed height. It should also be noted that two concavities positioned to face each other with the projection 22a interposed therebetween are formed in the surface region of the insulating substrate 22.

The method of forming the projection 22a is not limited to the method described above, and another method can be employed for forming the projection 22a. For example, it is possible to employ a wet etching that uses a chemical liquid or a reactive ion etching in place of the Ar ion beam etching. Alternatively, the projection 22a can be formed by depositing a thin film of an insulating nonmagnetic material on the entire surface of the insulating substrate 22, followed by selectively removing the thin film of the insulating nonmagnetic material except the portion where the projection 22a is to be formed.

The step of forming the thin film yokes will now be described. A pair of thin film yokes 24b and 24c positioned to face each other with the projection 22a interposed therebetween and electrically separated from each other completely are formed in the step of forming the thin film yokes. The thin film yokes 24b and 24c noted above are formed by depositing a thin film of a soft magnetic material on both sides of the projection 22a formed on the surface of the insulating substrate 22, followed by partially removing the thin film of the soft magnetic material until at least the tip surface of the projection 22a is exposed to the outside.

To be more specific, a soft magnetic thin film 24d is deposited in a prescribed thickness on the entire surface of the insulating substrate 22 as shown in FIG. 8F. Then, a first protective film 30 of an insulating nonmagnetic material is deposited in a prescribed thickness on the surface of the soft magnetic thin film 24d, as shown in FIG. 8G. As described previously, the first protective film 30 serves to protect the soft magnetic thin film 24d, i.e., the thin film yokes 24b and 24c, in the step of planarizing the surface of the insulating substrate 22. Also, the material of the first protective film 30 is selected appropriately in accordance with the planarizing method.

In the next step, the first protective film 30 and the soft magnetic thin film 24d are partially removed until at least the tip surface of the projection 22a is exposed to the outside so as to form the thin film yokes 24b and 24c, which are separated from each other, on both sides of the projection 22a, as shown in FIG. 8H. As a result, formed on the surface of the insulating substrate 22 is a GMR film-forming surface including the tip surface of the projection 22a and the upper surfaces of the thin film yokes 24b and 24c contiguous to the tip surface of the projection 22a. It should also be noted that the length of the GMR film-forming surface in the direction of the gap length is larger than the gap length, and the length of the GMR film-forming surface in the width direction is larger than the gap width. Also, the first protective layer 30 is separated in this stage into right and left first protective layers 30b and 30c.

The method of removing the unnecessary portion of the soft magnetic thin film 24d for forming the GMR film-forming surface is not particularly limited so as to make it possible to employ various methods. To be more specific, it is desirable to employ the methods described in the following.

A first method is a mechanical polishing method in which the first protective film 30 is formed on the entire surface of the insulating substrate 22, followed by mechanically polishing the surface of the first protective film 30 formed on the insulating substrate 22. In this case, it is desirable for the first protective film 30 to be formed of, for example, a $Al_2O_3$ film, a $SiO_2$ film, a $Si_3N_4$ film, or a photoresist film hard-baked under temperatures not lower than 200° C.

A second method is an etch back method, in which the first protective film 30 is formed on the entire surface of the insulating substrate 22 so as to moderate the irregularity on the surface of the insulating substrate 22, followed by etching the surface of the first protective film 30 formed on the insulating substrate 22 by utilizing an ion beam. In this case, it is desirable for the first protective film 30 to be formed of a photoresist film post-baked at 90 to 120° C.

If the photoresist film (first protective film 30) formed on the surface of the insulating substrate 22, i.e., on the surface of the soft magnetic thin film 24d formed on the insulating substrate 22, is etched, the photoresist film alone is etched first. With progress of the etching, the convex portion of the soft magnetic thin film 24d comes to be exposed in the surface of the photoresist film. Then, the photoresist film and the convex portion of the soft magnetic thin film 24d are etched simultaneously.

In general, the uppermost surface of the photoresist film is not rendered completely flat. In addition, there is a difference in the etching rate between the soft magnetic thin film 24d and the photoresist film. It follows that it is difficult to planarize completely the surface of the insulating substrate 22 by a single etching. Such being the situation, the etching is once stopped before the photoresist film is completely etched away, and the photoresist film is removed (peeled off). In this fashion, the operations including (1) formation of the photoresist film and application of the post baking at 90 to 120° C., (2) etching, and (3) removing (peeling off) are repeated a prescribed number of times until the surface of the insulating substrate 22 is planarized substantially completely.

Incidentally, it suffices to remove partially the soft magnetic thin film 24d until at least the tip surface of the projection 22a is exposed to the outside and, thus, it is unnecessary to remove completely the first protective film 30, as shown in FIG. 8H. However, where the projection 22a has an allowance in height, it is possible to remove partially the soft magnetic thin film 24d until the first protective film 30 is removed completely.

The step of forming the GMR film will now be described. In the step of forming the GMR film, a GMR film 26 is deposited on the GMR film-forming surface formed on the surface of the insulating substrate 22, followed by processing the deposited GMR film 26 into a prescribed shape. To be more specific, it is desirable for the step of forming the GMR film to be carried out as follows.

In the first step, a photoresist film 38 is newly formed on the surface of the insulating substrate 22 except the region in which the GMR film 26 is to be formed, as shown in FIG. 8I. The photoresist film 38 is formed by a method similar to that described previously in conjunction with the step for forming the projection 22a. In this stage, the length of the region for forming the GMR film 26, i.e., the region in which the photoresist film 38 is not formed, in the direction of the gap length is set sufficiently larger than the gap length. Also, where a high sensitivity is required, it is desirable for the length of the region for forming the GMR film 26 in the direction of the gap width to be smaller than the gap width, though the length of the particular region noted above is determined in accordance with, for example, the required sensitivity to the magnetic field and the electrical resistance.

In the next step, the GMR film 26 having a prescribed composition is deposited on the entire surface of the insulating substrate 22, as shown in FIG. 8J. As a result, a sound GMR film 26 having a prescribed thickness is formed in the region longer than the gap length in the direction of the gap length. At the same time, the GMR film 26 formed in the gap 24a is electrically connected to the thin film yokes 24b and 24c. After formation of the GMR film 26, the photoresist film 38 is removed by the lift-off method from the surface of the insulating substrate 22, as shown in FIG. 8K.

Incidentally, another method can be employed in place of the method described above for forming the GMR film 26. To be more specific, the GMR film 26 can be formed in the gap 24a by the method comprising the steps of (1) depositing the GMR film 26 directly on the entire planarized surface of the insulating substrate 22, (2) masking only the region in the vicinity of the projection 22a with, for example, a photoresist film, and (3) removing by etching that region alone of the GMR film 26 which is not covered with, for example, the photoresist film.

The step of forming the electrode will now be described. The electrodes 28b and 28c are formed in the edge portions of the thin film yokes 24b and 24c in the step of forming the electrode. To be more specific, a photoresist film 38 is newly formed on the insulating substrate 22 excluding the regions in which the electrodes 28b, 28c are to be formed, as shown in FIG. 8L. The photoresist film 38 is formed by the method similar to that described previously in conjunction with the step of forming the projection. Then, a thin film 28a having a prescribed thickness and formed of an electrically conductive material is deposited from above the photoresist film 38, as shown in FIG. 8M, followed by removing (lifting off) the photoresist film 38. As a result, it is possible to form the electrodes 28b and 28c in the edge portions of the thin film yoke s 24b and 24c, respectively, as shown in FIG. 8N. Incidentally, the electrode 28b alone is shown in FIG. 8N.

Incidentally, the method of forming the electrodes 28b and 28c is not limited to the method described above. For example, it is possible to form the electrodes 28b and 28c by the method comprising the step of depositing a thin film 28a consisting of an electrically conductive material directly on the entire surface of the insulating substrate 22 except the region in the vicinity of the GMR film 26, the step of covering the required portion with a photoresist film, and the step of removing the unnecessary portion by, for example, an Ar ion beam etching, a wet etching utilizing a chemical liquid, or a reactive ion etching. In the case of employing the particular method, however, it is necessary to form in advance a protective film for protecting the GMR film and the thin film yokes positioned below that portion of the thin film 28a which is to be removed.

The step of forming the surface protective film will now be described. A second protective film 32 serving to protect the thin film yokes 24b, 24c, and the GMR film 26 is formed on the uppermost surface of the insulating substrate 22 in the step of forming the surface protective film. To be more specific, a photoresist film 38 is newly formed on the insulating substrate 22 excluding the region in which the second protective film 32 is to be formed, as shown in FIG. 8O. The photoresist film 38 is formed by the method described previously in conjunction with the step of forming the projection. In this case, it is advisable to form the photoresist film 38 such that the electrodes 28b, 28c (the electrode 28b alone is shown in FIG. 8O) are partly covered with the second protective film 32. Then, a second protective film 32 is deposited in a prescribed thickness from above the photoresist film 38 as shown in FIG. 8P, followed by removing (lifting off) the photoresist film 38. As a result, obtained is the thin film magnetic sensor 20 according to the first embodiment of the present invention, as shown in FIG. 8Q.

Incidentally, the method of forming the second protective film 32 is not limited to the method described above. Alternatively, the second protective film 32 can be formed by the method comprising the step of, for example, depositing the second protective film 32 directly on the entire surface of the insulating substrate 22, the step of forming a photoresist film in a manner to cover the required portion of the second protective film 32, and the step of removing the unnecessary portion of the second protective film 32 by an Ar ion beam etching, a wet etching utilizing a chemical liquid, or a reactive ion etching.

The function and effect of the thin film magnetic sensor 20 according to the first embodiment of the present invention will now be described.

The conventional method of manufacturing the thin film magnetic sensor comprises depositing a soft magnetic thin film on the surface of an insulating substrate, forming a concave groove (gap) having a small width in the soft magnetic thin film thus formed so as to obtain thin film yokes positioned to face each other with the small gap interposed therebetween, and depositing a GMR film on the thin film yokes including the gap.

In the conventional method described above, however, the cross sectional shape of bottom portion of the GMR film formed within the gap is rendered triangular or trapezoid. As a result, the contact area between the side wall portion of the GMR film and the bottom portion of the GMR film is rendered markedly smaller than the average cross sectional area in the thickness direction of the GMR film. In the extreme case, the side wall portion and the bottom portion of the GMR film are brought into a linear contact. It follows that the contact electrical resistance between the thin film yoke and the GMR film is markedly changed by a slight change in the manufacturing conditions. In addition, the magnetic characteristics of the thin film magnetic sensor are rendered unstable.

Also, the metal-insulator system nano granular material, which is excellent in the magnetic characteristics, is brittle and, thus, when deposited within the gap so as to form a thin film, the film tends to be cracked along the boundary line between the thin film portion growing from the planar bottom portion of the gap and the thin film portion growing from the side wall of the gap. It follows that, in the case of using the metal insulator system nano granular material as the GMR film of the thin film magnetic sensor and deposited the material within the gap, the thin film magnetic sensor tends to be rendered unstable both electrically and magnetically.

On the other hand, the thin film magnetic sensor 20 according to the first embodiment of the present invention is constructed such that the projection 22a is formed on the surface of the insulating substrate 22 and the thin film yokes 24b and 24c are deposited on both sides of the projection 22a. It follows that the gap 24a is under the state of being loaded with the projection 22a formed of an insulating nonmagnetic material. Such being the situation, if the GMR film 26 is deposited on the surface of the insulating substrate 22 after planarization of the tip surface of the projection 22a, the deposition of the GMR film 26 is not impaired by the side walls of the thin film yokes 24b and 24c.

Also, since the tip surface of the projection 22a and the region in the vicinity of the tip surface of the projection 22a acts as a relatively flat GMR film-forming surface longer than the gap length in the direction of the gap length, and the GMR film 26 is formed on the GMR film-forming surface, it is possible to form a sound GMR film 26 having a substantially uniform thickness in at least the gap 24a. Also, the lower surface of the GMR film 26 can be electrically connected without fail to the upper surfaces of the thin film yokes 24b and 24c. In addition, even in the case where a relatively brittle material is used for forming the GMR film 26, the GMR film 26 is unlikely to be cracked. It follows that the contact electrical resistance between the GMR film 26 and the thin film yokes 24b, 24c is not significantly changed even if the manufacturing conditions are slightly changed so as to stabilize the magnetic characteristics of the thin film magnetic sensor.

Second Embodiment

Figure 9:
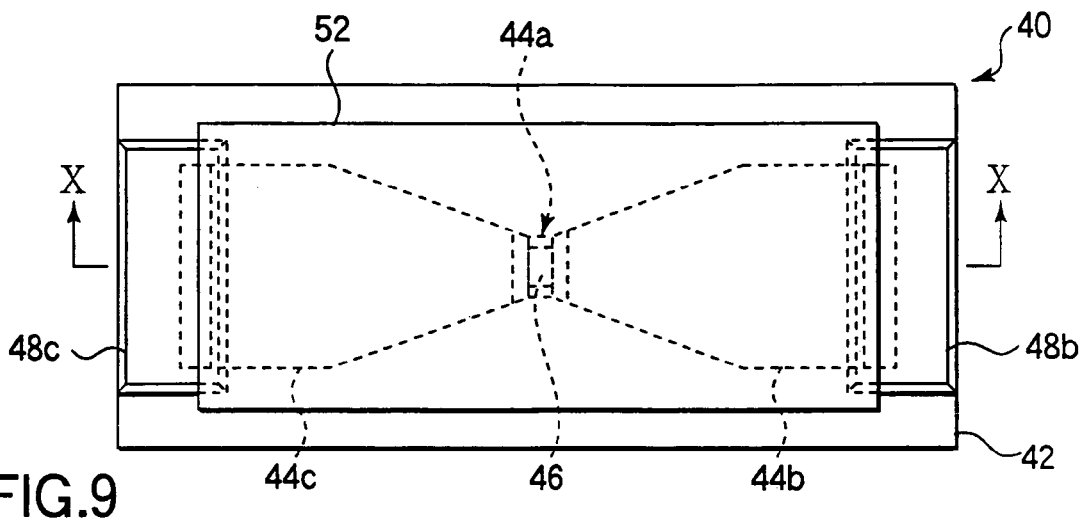
FIG. 9 is a plan view schematically showing the construction of a thin film magnetic sensor according to a second embodiment of the present invention.
Figure 10:
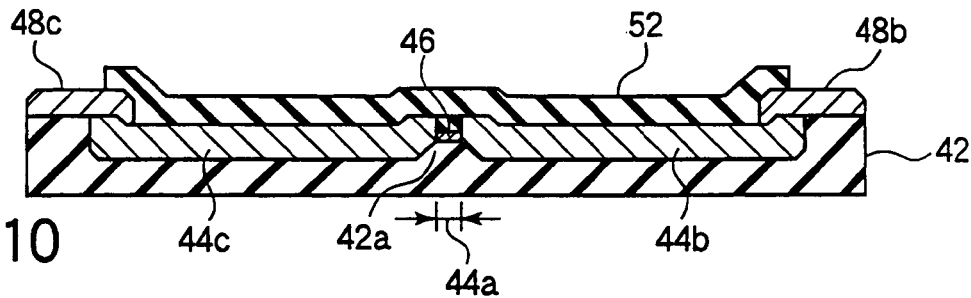
FIG. 10 is a cross sectional view along the line X—X shown in FIG. 9.
Figure 11:
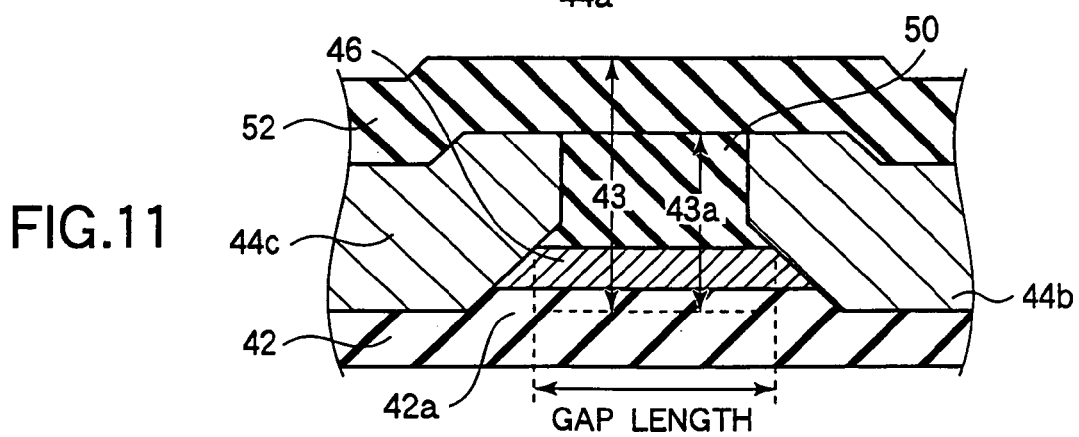
FIG. 11 is a cross sectional view showing the construction of a thin film magnetic sensor in a magnified fashion the region in the vicinity of the gap included in the thin film magnetic sensor according to the second embodiment of the present invention.
Figure 12:
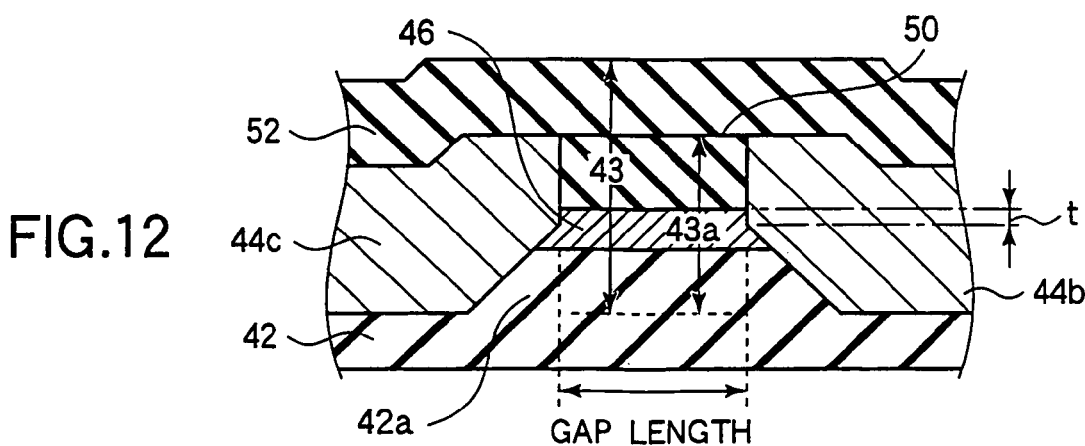
FIG. 12 is a cross sectional view showing another construction of a thin film magnetic sensor in a magnified fashion the region in the vicinity of the gap included in the thin film magnetic sensor according to the second embodiment of the present invention.

A thin film magnetic sensor according to a second embodiment of the present invention will now be described. FIG. 9 is a plan view schematically showing the construction of a thin film magnetic sensor 40 according to a second embodiment of the present invention, FIG. 10 is a cross sectional view along the line X—X shown in FIG. 9, FIG. 11 is a cross sectional view showing the construction of a thin film magnetic sensor in a magnified fashion the region in the vicinity of the gap included in the thin film magnetic sensor according to the second embodiment of the present invention, and FIG. 12 is a cross sectional view showing another construction of a thin film magnetic sensor in a magnified fashion the region in the vicinity of the gap included in the thin film magnetic sensor according to the second embodiment of the present invention.

As shown in the drawings, the thin film magnetic sensor 40 according to the second embodiment of the present invention comprises an insulating substrate 42, a pair of thin film yokes 44b, 44c, and a GMR film 46. The thin film yokes 44b and 44c are positioned to face each other with a gap 44a interposed therebetween. Also, the GMR film 46 is formed in the gap 44a so as to be electrically connected to the thin film yokes 44b and 44c. Also, electrodes 48b and 48c are connected to the edge portions of the thin film yokes 44b and 44c, respectively. Further, the uppermost surface of the insulating substrate 42 is covered with a second protective film 52.

The thin film yokes 44b and 44c are deposited on both sides of a projection 43a formed on the surface of the insulating substrate 42. Also, the projection 43a includes a tapered convex portion 42a of the insulating substrate 42, which is formed by etching the insulating substrate 42, the GMR film 46 layered on the upper surface of the tapered convex portion 42a of the insulating substrate 42, and a third protective film 50 layered on the GMR film 46. Further, in the second embodiment of the present invention, a gap column 43 includes the projection 43a and a second protective film 52 layered on the projection 43a. In other words, in the second embodiment of the present invention, that surface of the GMR film 46 which is exposed to the side surface and/or the lower inclined surface of the gap column 43 is electrically connected to the side surfaces and/or the lower inclined surfaces of the thin film yokes 44b and 44c.

The gap column 43 of the particular construction can be formed by the method, comprising the steps of (1) depositing the GMR film 46 and the third protective film 50 in the order mentioned on the surface of the insulating substrate 42, (2) removing the third protective film 50 entirely and removing the GMR film 46 partly or entirely until the GMR film 46 is exposed partly or entirely to the side wall surface of the projection 43a with the region forming the tip portion of the projection 43a left unremoved, and (3) forming the thin film yokes 44b and 44c on both sides of the projection 43a, followed by depositing the second protective film 52 on the entire surface.

It is possible for that portion of the projection 43a which is perpendicular to the upper surface of the insulating substrate 42, i.e., the side wall surface of the projection 43a, to be formed of the third protective film 50 alone. In this case, those portions of the GMR film 46 which are exposed to the inclined side surfaces of the projection 43a can be connected to the thin film yokes 44b and 44c without fail, though the sensitivity is somewhat lowered. Further, in order to obtain a high sensitivity to the magnetic field, it is desirable for the GMR film 46 to be included in the side wall surface of the projection 43a, as shown in FIG. 12. It is desirable for the thickness "t" of that portion of the GMR film 46 which constitutes a part of the side wall surface of the projection 43a to be not smaller than ½ of the thickness of the GMR film 46. The sensitivity to the magnetic field can be increased with increase in the thickness "t" of that portion of the GMR film 46 which constitutes a part of the side wall surface of the projection 43a.

Any kind of an insulating nonmagnetic material can be used for forming the third protective film 50 constituting the tip portion of the projection 43a. To be more specific, the third protective film 50 can be formed of, for example, $Al_2O_3$, $SiO_2$, $Si_3N_4$ or a photoresist hard-baked under temperatures not lower than 200° C.

Incidentally, the insulating substrate 42, the projection 43a, thin film yokes 44b, 44c, the GMR film 46, the electrodes 48b and 48c, the second protective film 52 and the other members are equal to the insulating substrate 22, the projection 22a, the thin film yokes 24b, 24c, the GMR film 26, the electrodes 28b and 28c, the second protective film 32 and the other members included in the thin film magnetic sensor 20 according to the first embodiment of the present invention and, thus, the description of the insulating substrate 42, etc. is omitted.

A method of manufacturing the thin film magnetic sensor 40 according to the second embodiment of the present invention will now be described.

Figure 13A:
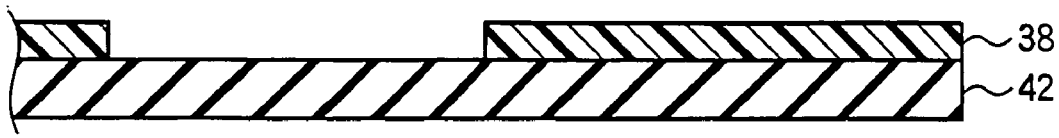
FIGS. 13A to 13P are cross sectional views collectively showing the manufacturing process of the thin film magnetic sensor according to the second embodiment of the present invention.
Figure 13B:
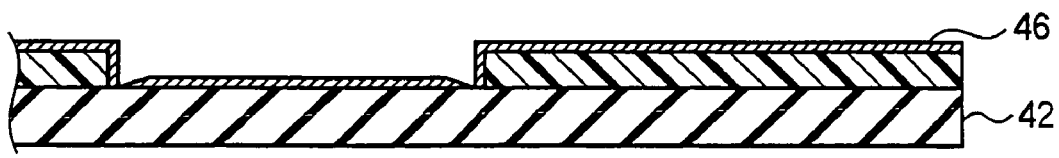
Figure 13C:
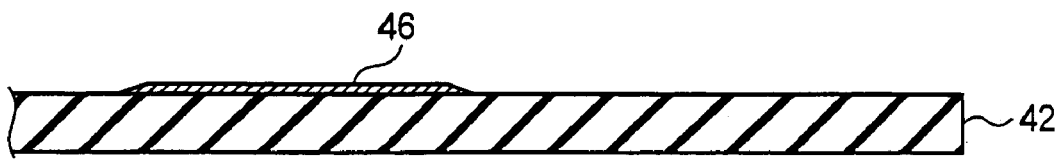
Figure 13D:
Figure 13E:
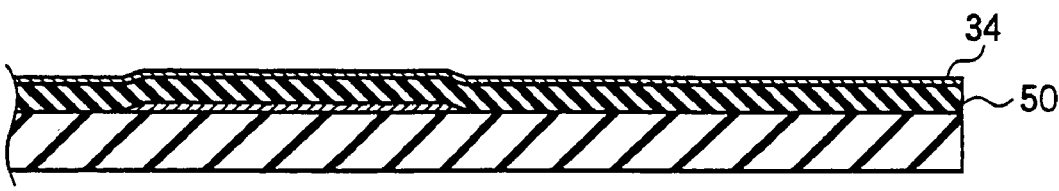
Figure 13F:
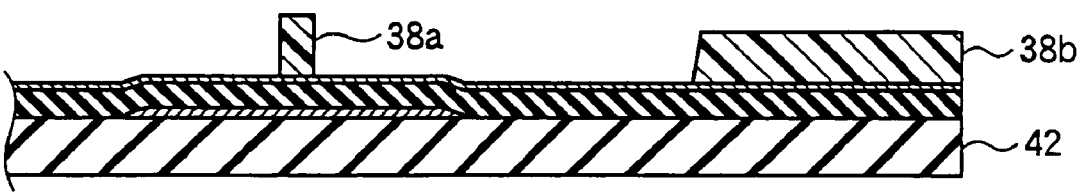
Figure 13G:
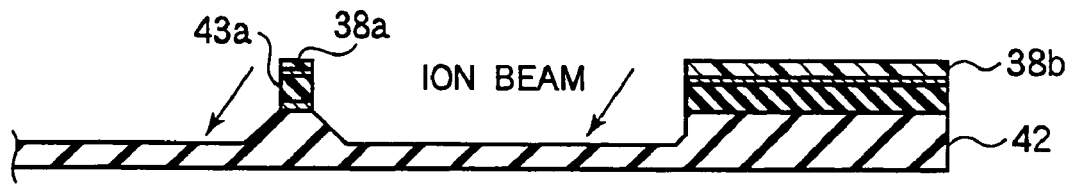
Figure 13H:
Figure 13I:
Figure 13J:
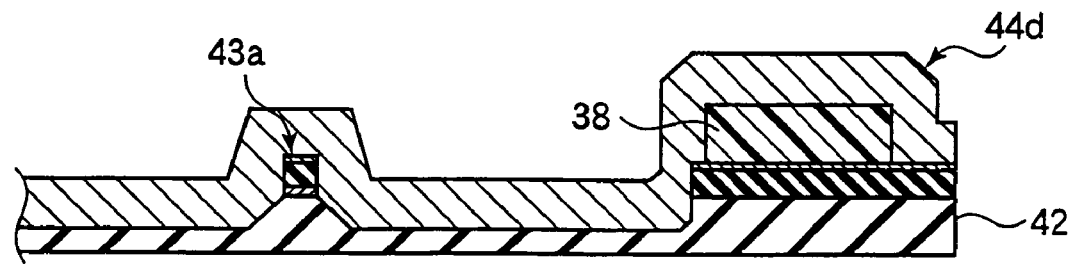
Figure 13K:
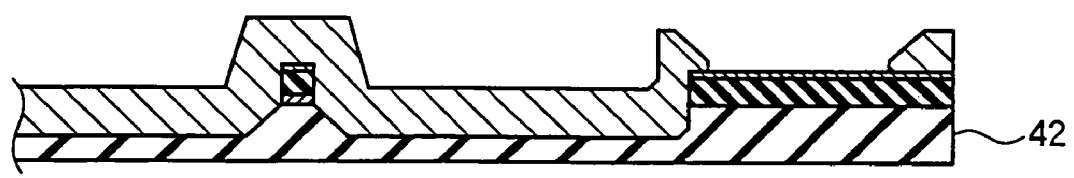
Figure 13L:
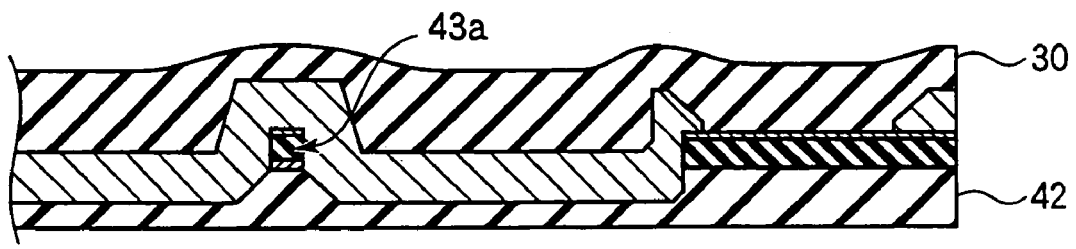
Figure 13M:
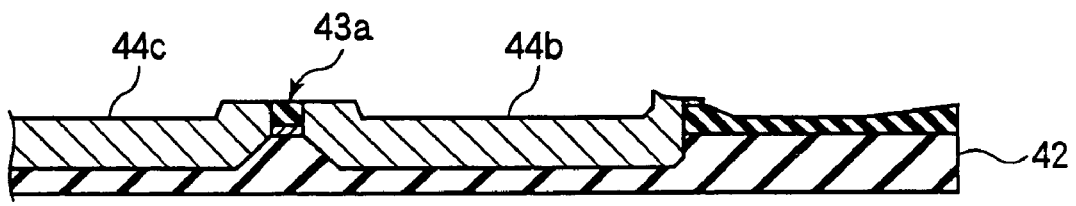
Figure 13N:
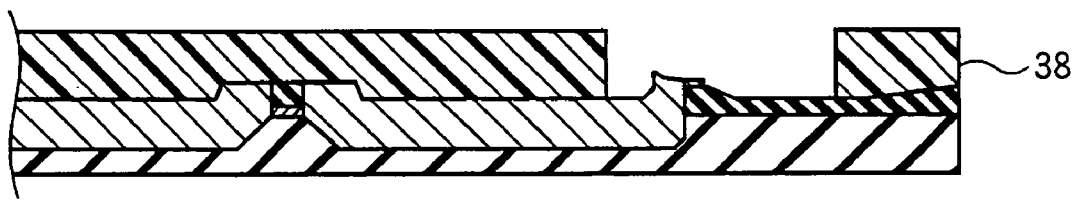
Figure 13O:
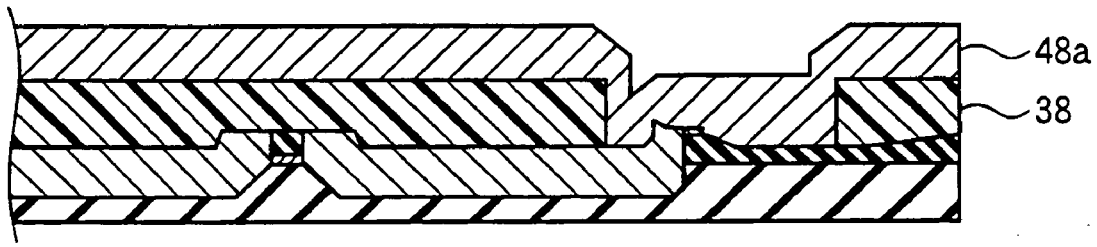
Figure 13P:
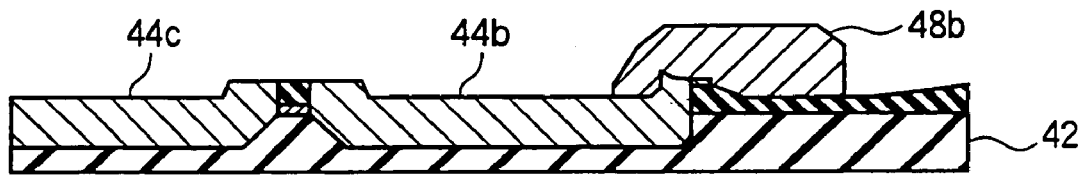

FIGS. 13A to 13P are cross sectional views collectively showing the manufacturing process of the thin film magnetic sensor according to the second embodiment of the present invention. The manufacturing process according to the second embodiment of the present invention comprises the step of forming the GMR film, the step of forming the projection, the step of forming the thin film yokes, the step of forming the electrodes, and the step of forming the surface protective film.

First of all, the step of forming the GMR film will now be described. In the step of forming the GMR film, a GMR film 46 is deposited on the surface of the insulating substrate 42. To be more specific, it is desirable for the step of forming the GMR film to be carried out as follows.

In the first step, a photoresist film 38 is formed on the planarized surface of the insulating substrate 42 except the region in which the GMR film 46 is to be formed, as shown in FIG. 13A. In this stage, the length of the region, in which the GMR film 46 is to be formed, in the direction of the gap length is set sufficiently larger than the gap length, and the width of the particular region noted above is defined in accordance with, for example, the required sensitivity to the magnetic field and the electrical resistance. In the next step, a GMR film 46 is formed on the entire surface of the insulating substrate 42 as shown in FIG. 13B, followed by lifting off the photoresist film 38 so as to form the GMR film 46 in the region in which the gap 44a is to be formed, as shown in FIG. 13C.

Incidentally, it is possible to employ another method for forming the GMR film 46 in place of the method described above. To be more specific, the GMR film 46 can also be formed by the method, comprising the steps of (1) depositing the GMR film 46 directly on the planarized entire surface of the insulating substrate 42, (2) masking only the region in which the projection 43a is to be formed and the region in the vicinity of the particular region noted above with, for example, a photoresist film, and (3) removing-by etching that region alone of the GMR film 46 which is not covered with, for example, the photoresist film, as in the first embodiment described previously.

The step of forming the projection will now be described. In the step of forming the projection, the projection 43a is formed by the method, comprising the step of further depositing a third protective film 50 on the GMR film 46, and the step of removing entirely the third protective film 50 and removing partly or entirely the GMR film 46, with the region forming the projection 43a left unremoved, until the GMR film 46 is exposed partly or entirely to the side wall surface of the projection 43a so as to form the projection 43a. To be more specific, it is desirable for the step of forming the projection to be carried out as follows.

In the first step, the third protective film 50 is deposited in a prescribed thickness on the entire surface of the insulating substrate 42 as shown in FIG. 13D. Incidentally, the accuracy in the shape of the projection 43a formed by the etching tends to be rendered poor with increase in the thickness of the third protective film 50. Such being the situation, it is desirable for the third protective film 50 to be formed as thin as possible.

In the next step, a penetration preventing film 34 consisting of, for example, a Cr thin film or a Ti thin film is formed on the third protective film 50, as shown in FIG. 13E, followed by forming a photoresist film 38a in the region in which the projection 43a is to be formed and another photoresist film 38b in the region in which the thin film yokes 44b, 44c are not formed, as shown in FIG. 13F. Incidentally, it is desirable to apply the post baking to the photoresist films 38a and 38b as in the first embodiment of the present invention described previously.

In the next step, an Ar ion beam etching is performed under prescribed conditions while rotating the insulating substrate 42 so as to form the projection 43a on the surface of the insulating substrate 42, as shown in FIG. 13G. The side walls in the tip portion of the projection 43a are perpendicular to the upper surface of the insulating substrate 42. Also, the projection 43a has a prescribed width (gap length) and a height. If the irradiating conditions are optimized, it is possible to permit the GMR film 46 to be exposed partly or entirely to the side wall surfaces, which are perpendicular to the upper surface of the insulating substrate 42, of the projection 43a. Further, the insulating substrate 42 is also etched simultaneously along the boundary line of the photoresist film 38b. The insulating substrate 42 is etched in this step in a direction substantially perpendicular to the upper surface of the insulating substrate 42 so as to form two concavities in the surface region of the insulating substrate 42 such that these two concavities are positioned to face each other with the projection 43a interposed therebetween. After completion of the etching, the photoresist film remaining on the surface of the insulating substrate 42 is removed (peeled off), as shown in FIG. 13H.

The step of forming the thin film yokes will now be described. In the step of forming the thin film yokes, a soft magnetic material is deposited on both sides of the projection 43a so as to form a pair of thin film yokes 44b and 44c positioned to face each other with the projection 43a interposed therebetween and electrically separated from each other completely. The thin film yokes 44b and 44c can be formed by the process substantially equal to the process described previously in conjunction with the first embodiment of the present invention.

Specifically, for forming the thin film yokes 44b and 44c, a photoresist film 38 is newly formed first on the surface of the insulating substrate 42 excluding the regions in which the thin film yokes 44b and 44c are to be formed, as shown in FIG. 13I. Then, a soft magnetic thin film 44d is deposited in a prescribed thickness on the entire surface of the insulating substrate 42, as shown in FIG. 13J, followed by removing the photoresist film 38 by the lift-off method as shown in FIG. 13K.

In the next step, a first protective film 30 is formed on the entire surface of the insulating substrate 42 as shown in FIG. 13L. Then, the first protective film 30 and the soft magnetic thin film 44d are partially removed by the mechanical polishing method or the etch back method described previously until the soft magnetic thin film 44d is removed completely from at least the tip surface of the projection 43a. As a result, the thin film yokes 44b and 44c are formed to face each other with the projection 43a interposed therebetween, as shown in FIG. 13M.

Incidentally, FIG. 13M shows that the first protective film 30 remaining on the thin film yokes 44b, 44c is removed (peeled off) completely after formation of the thin film yokes 44b and 44c. However, it is possible for the first protective film 30 to be partly left unremoved on the thin film yokes 44b and 44c. Also, the mechanical polishing method or the etch back method employed for removing the unnecessary portion of the soft magnetic thin film 44d can be replaced by a method (hereinafter referred to as an "extra film removing method), comprising the steps of (1) masking the soft magnetic thin film 44d with, for example, a photoresist film except the portion deposited on the tip surface of the projection 43a, and (2) removing by etching that portion of the soft magnetic thin film 44d which is not covered with, for example, the photoresist film.

The electrode forming step will now be described. The electrode forming step is carried out by the procedures equal to those described previously in conjunction with the first embodiment of the present invention. Specifically, a photoresist film 38 is newly formed on the surface of the insulating substrate 42 except the regions in which the electrodes 48b and 48c are to be formed as shown in FIG. 13N, followed by depositing a thin film 48a consisting of an electrically conductive material on the surface of the insulating substrate 22, as shown in FIG. 13O, and subsequently removing (lifting off) the photoresist film 38, as shown in FIG. 13P. As a result, the electrodes 48b and 48c can be formed on the edge portions of the thin film yokes 44b and 44c, respectively. Incidentally, the electrode 48b alone is shown in FIG. 13P.

Further, the second protective film 52 is formed on the surface of the insulating substrate 42 by carrying out the step of forming the surface protective film by the procedures similar to those described previously in conjunction with the first embodiment of the present invention so as to obtain the thin film magnetic sensor 40 according to the second embodiment of the present invention.

The function and effect of the thin film magnetic sensor 40 according to the second embodiment of the present invention will now be described. In the second embodiment of the present invention, the GMR film 46 and the third protective film 50 are deposited in the order mentioned on the surface of the insulating substrate 42, followed by etching the surface of the insulating substrate 42 under prescribed conditions. As a result, it is possible to form the projection 43a having the GMR film 46 exposed partly or entirely to the side wall surface thereof.

When depositing the soft magnetic thin film 44d, the shading is scarcely formed around the projection 43a projecting upward from the surface of the insulating substrate 42 unlike the case of depositing the soft magnetic thin film within a small groove. It follows that the soft magnetic thin film 44d is deposited in the second embodiment of the present invention such that the soft magnetic thin film 44d is in direct contact strongly with the side wall surface of the projection 43a. As a result, a face contact is achieved without fail between the thin film yokes 44b, 44c each formed of the soft magnetic thin film 44d and the GMR film 46 exposed to the side wall surfaces of the projection 43a. Also, the contact electrical resistance between the thin film yokes 44b, 44c and the GMR film 46 is not appreciably changed even if the manufacturing conditions are slightly changed so as to stabilize the magnetic characteristics of the thin film magnetic sensor.

It should be noted that, if the thin film yokes 44b and 44c are magnetized by the external magnetic field, the magnetic flux leaking from the thin film yokes 44b, 44c run mainly through the region between the side wall surfaces of the projection 43a. It follows that, where the GMR film 46 is exposed to the side wall surfaces of the projection 43a, a stronger magnetic field acts on the GMR film 46 so as to further improve the sensitivity of the thin film magnetic sensor to the magnetic field.

Third Embodiment

Figure 14:
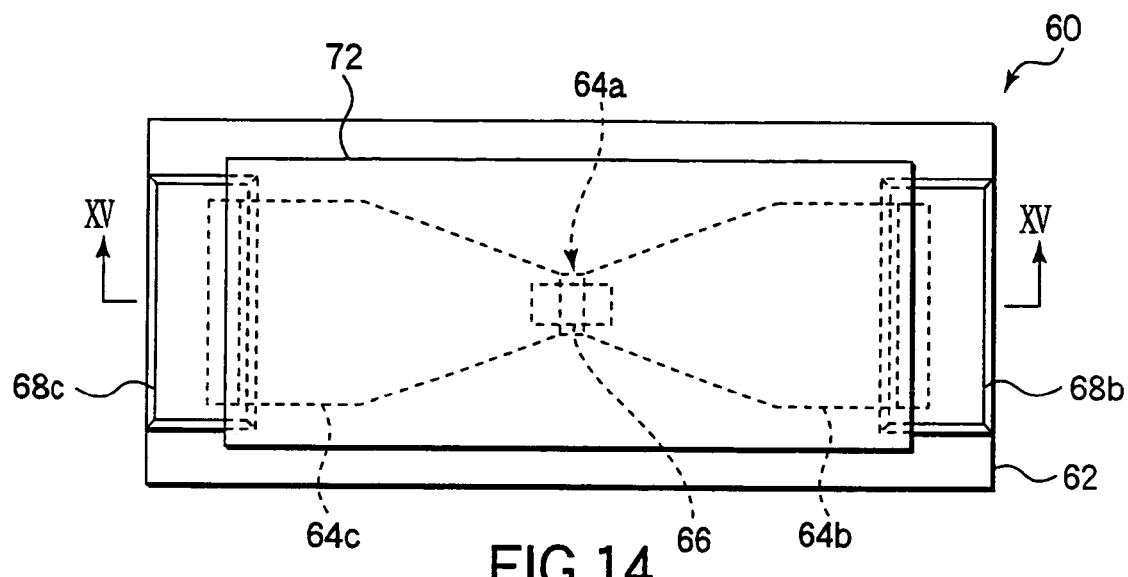
FIG. 14 is a plan view schematically showing the construction of a thin film magnetic sensor according to a third embodiment of the present invention.
Figure 15:
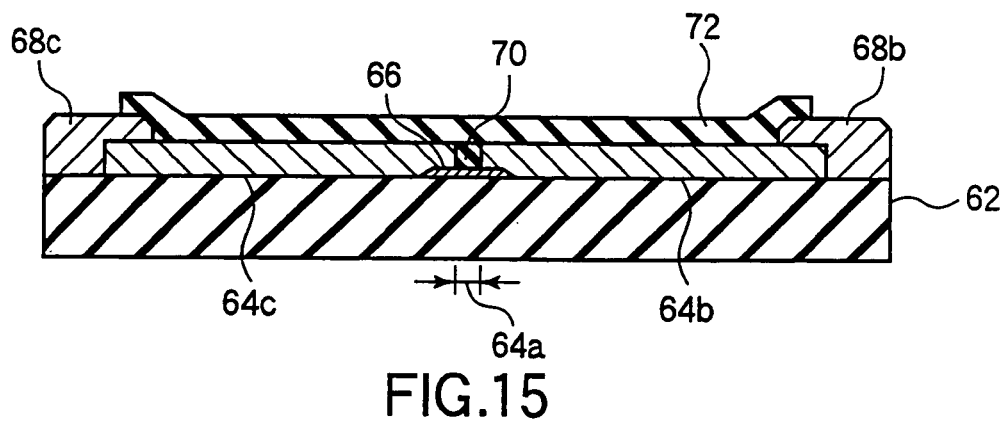
FIG. 15 is a cross sectional view along the line XV—XV shown in FIG. 14.
Figure 16:
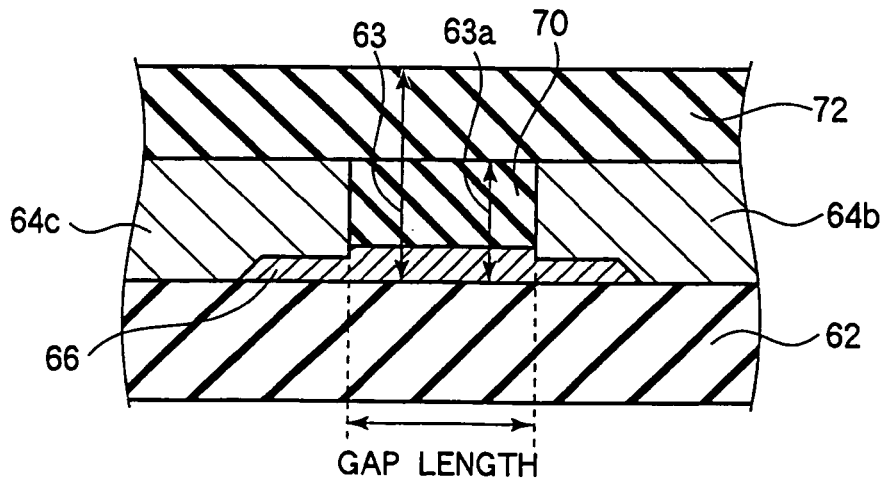
FIG. 16 is a cross sectional view showing in a magnified fashion the region in the vicinity of the gap included in the thin film magnetic sensor according to the third embodiment of the present invention.

A thin film magnetic sensor according to a third embodiment of the present invention will now be described. FIG. 14 is a plan view schematically showing the construction of a thin film magnetic sensor 60 according to a third embodiment of the present invention, FIG. 15 is a cross sectional view along the line XV—XV shown in FIG. 14, and FIG. 16 is a cross sectional view showing in a magnified fashion the region in the vicinity of the gap included in the thin film magnetic sensor according to the third embodiment of the present invention.

As shown in the drawings, the thin film magnetic sensor 60 according to the third embodiment of the present invention comprises an insulating substrate 62, a pair of thin film yokes 64b, 64c, and a GMR film 66. The thin film yokes 64b and 64c are positioned to face each other with a gap 64a interposed therebetween. Also, the GMR film 66 is formed in the gap 64a so as to be electrically connected to the thin film yokes 64b and 64c. Further, electrodes 68b and 68c are connected to the edge portions of the thin film yokes 64b and 64c, respectively, and the uppermost surface of the insulating substrate 62 is covered with a second protective film 72.

The GMR film 66 is deposited on the surface of the insulating substrate 62. Also, a projection 63a consisting of the GMR film 66 and a fourth protective film 70 is formed in the gap 64a, and the thin film yokes 64b, 64c are formed on both sides of the projection 63a. To be more specific, in the third embodiment of the present invention, the upper surface of the GMR film 66 is in an electric face contact with the lower surfaces of the thin film yokes 64b, 64c. Further, in the third embodiment of the present invention, a gap column 63 consists of the projection 63a and the second protective film 72.

In forming the projection 63a, the GMR film 66 and the fourth protective film 70 formed of an insulating nonmagnetic material are successively deposited in the order mentioned on the surface of the insulating substrate 62, followed by partially removing the fourth protective film 70 until at least the surface of the GMR film 66 is exposed to the outside. In this stage, the fourth protective film 70 in the region forming the projection 63a is left unremoved. The materials suitable for use as the material of the fourth protective film 70 include, for example, $Al_2O_3$, $SiO_2$, $Si_3N_4$ and photoresist hard-baked under temperatures not lower than 200° C.

Incidentally, the insulating substrate 62, the projection 63a, the thin film yokes 64b and 64c, the GMR film 66, the electrodes 68b and 68c, the second protective film 72 and the other members are equal to the insulating substrate 22, the projection 22a, the thin film yokes 24b and 24c, the GMR film 26, the electrodes 28b and 28c, the second protective film 32 and the other members included in the thin film magnetic sensor 20 according to the first embodiment of the present invention and, thus, the description of the insulating substrate 62, etc. is omitted.

The manufacturing process of the thin film magnetic sensor 60 according to the third embodiment of the present invention will now be described.

Figure 17A:
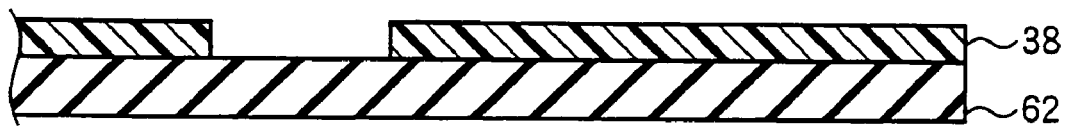
FIGS. 17A to 17O are cross sectional views collectively showing the manufacturing process of the thin film magnetic sensor according to the third embodiment of the present invention.
Figure 17B:
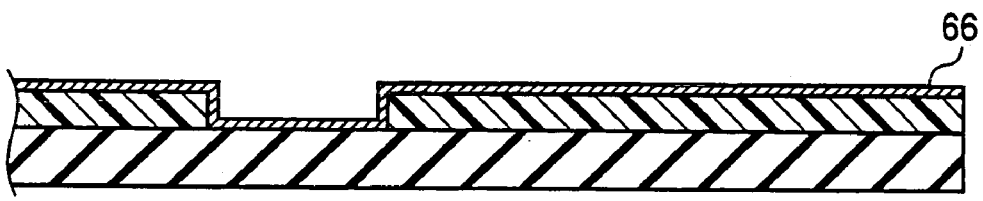
Figure 17C:
Figure 17D:
Figure 17E:
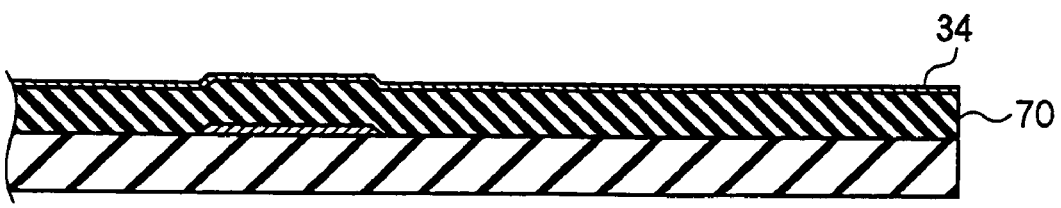
Figure 17F:
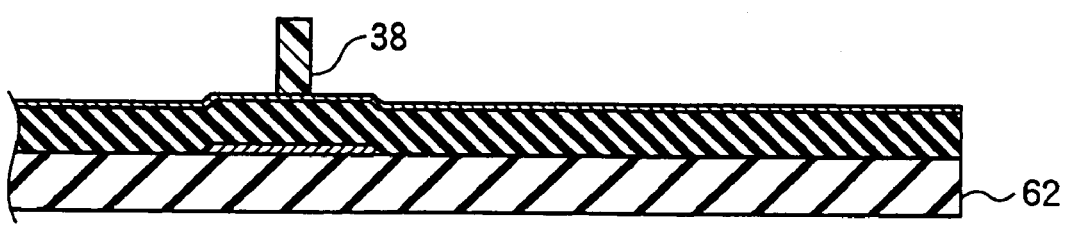
Figure 17G:
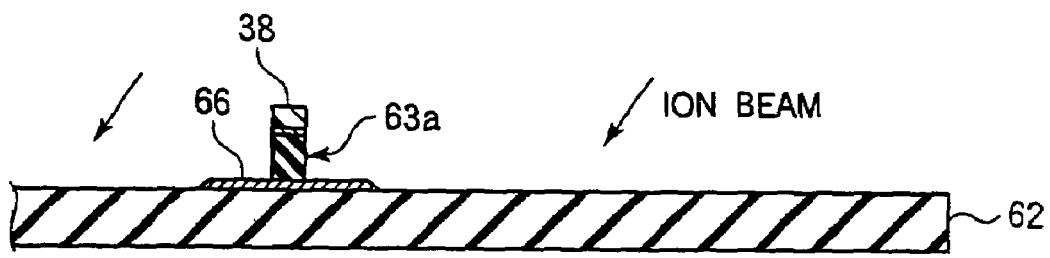
Figure 17H:
Figure 17I:
Figure 17J:
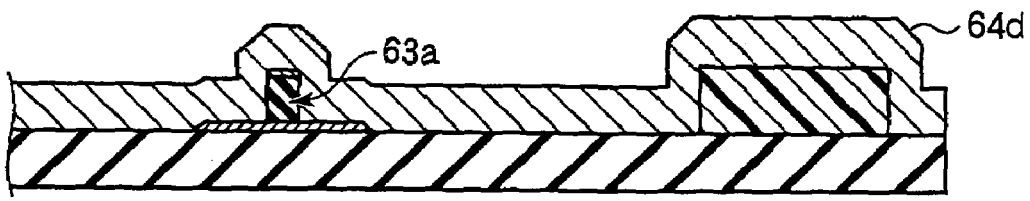
Figure 17K:
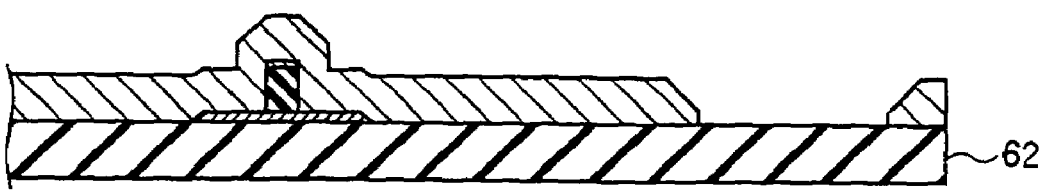
Figure 17L:
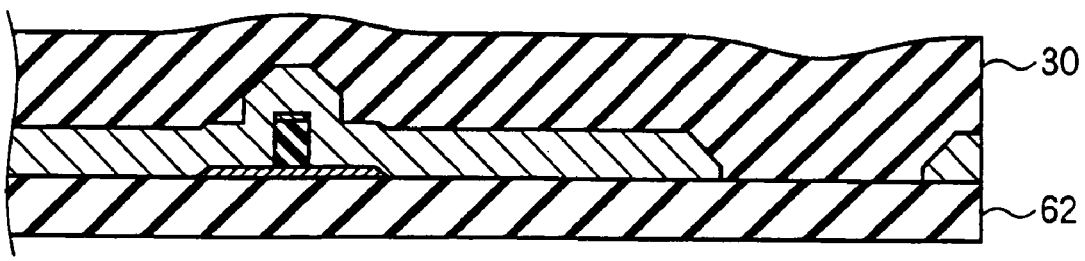
Figure 17M:
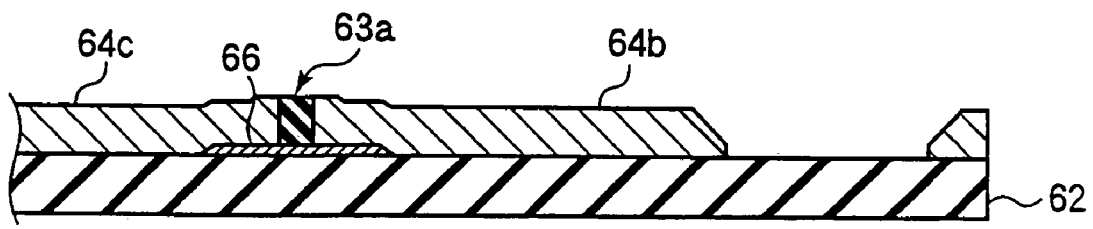
Figure 17N:
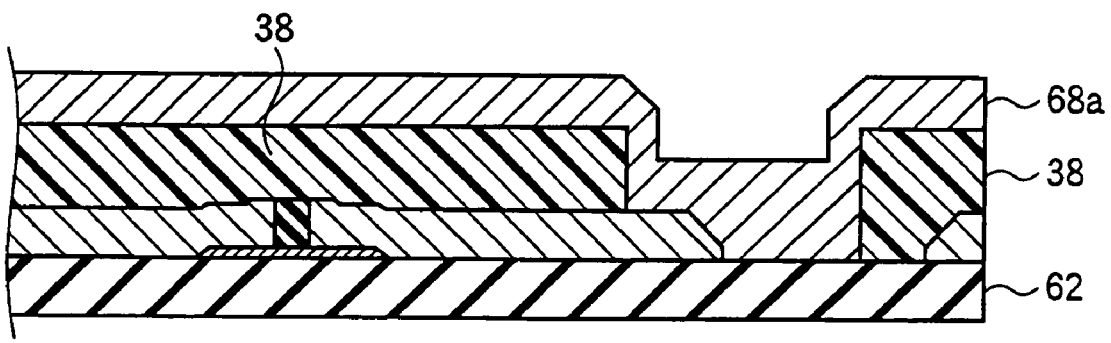
Figure 17O:
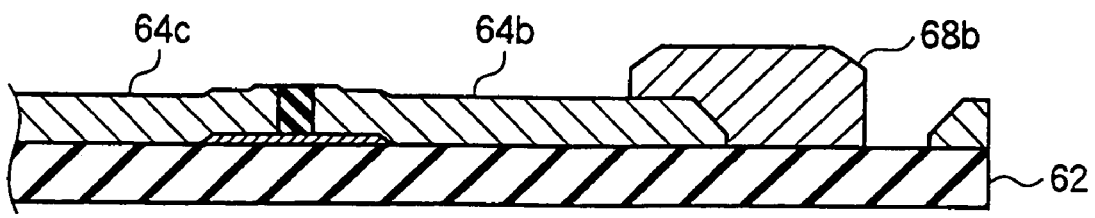

FIGS. 17A to 17O are cross sectional views collectively showing the manufacturing process of the thin film magnetic sensor according to the third embodiment of the present invention. The manufacturing process for this embodiment comprises the step of forming a GMR film, the step of forming a projection, the step of forming thin film yokes, the step of forming electrodes, and the step of forming a surface protective film.

The step for forming the GMR film in the third embodiment of the present invention is substantially equal to that in the second embodiment of the present invention described previously. To be more specific, a photoresist film 38 is formed first on the planarized surface of the insulating substrate 62 except the region in which the GMR film 66 is to be formed, as shown in FIG. 17A. Then, the GMR film 66 having a prescribed composition is deposited in a prescribed thickness on the photoresist film 38, as shown in FIG. 17B, followed by removing (lifting off) the photoresist film 38 as shown in FIG. 17C. In this fashion, it is possible to form the GMR film 66 that is longer than the gap length in the direction of the gap length.

The step for forming the projection will now be described. In the step for forming the projection, the fourth protective film 70 is further deposited on the GMR film 66 formed on the surface of the insulating substrate 62, followed by partially removing the fourth protective film 70 until at least the surface of the GMR film 66 is exposed to the outside. In this stage, that region of the fourth protective film 70 which forms the projection 63a is left unremoved. To be more specific, it is desirable for the step of forming the projection to be carried out as follows.

To be more specific, a fourth protective film 70 is deposited in a prescribed thickness on the entire surface of the insulating substrate 62, as shown in FIG. 17D. Incidentally, the accuracy of the shape of the projection 63a formed by the etching in the subsequent step tends to be lowered with increase in the thickness of the fourth protective film 70. Such being the situation, it is desirable for the fourth protective film 70 to be formed as thin as possible, as in the first embodiment of the present invention described previously.

In the next step, a penetration preventing film 34 consisting of, for example, a Cr thin film or a Ti thin film is formed on the fourth protective film 70, as shown in FIG. 17E, followed by forming a photoresist film 38 in the portion where the projection 63a is to be formed, as shown in FIG. 17F.

In the next step, an Ar ion beam etching is carried out while rotating the insulating substrate 62 so as to remove partially the penetration preventing film 34 and the fourth protective film 70. The ion beam etching is carried out under the conditions which permit the ion beam to run in a direction relatively close to the vertical direction. As a result, formed is the projection 63a on the surface of the GMR film 66, as shown in FIG. 17G. The projection 63a thus formed has a side wall having an optional angle relative to the upper surface of the insulating substrate 62. Also, the projection 63a has a prescribed width (gap length) and a prescribed height. Incidentally, if the etching conditions are optimized, it is possible for the projection 63a to be shaped like a column free from the tapered portion and substantially perpendicular to the upper surface of the insulating substrate 62. After completion of the etching, the photoresist film 38 remaining on the tip surface of the projection 63a is removed (peeled off), as shown in FIG. 17H.

The step of forming the thin film yokes will now be described. In the step of forming the thin film yokes, a soft magnetic thin film 64d is deposited on both sides of the projection 63a so as to form a pair of thin film yokes 64b, 64c positioned to face each other with the projection 63a interposed therebetween and electrically separated from each other completely. The thin film yokes 64b and 64c can be formed by the method substantially equal to the method employed in the first embodiment of the present invention described previously.

To be more specific, a photoresist film 38 is newly formed on the surface of the insulating substrate 62 except the regions where the thin film yokes 64b, 64c are to be formed, as shown in FIG. 17I. Then, a soft magnetic thin film 64d is deposited in a prescribed thickness on the entire surface of the insulating substrate 62 as shown in FIG. 17J, followed by removing (lifting off) the photoresist film 38 as shown in FIG. 17K.

In the next step, a first protective film 30 is formed on the entire surface of the insulating substrate 62 as shown in FIG. 17L, followed by partially removing the soft magnetic thin film 64d by the mechanical polishing method or the etch back method until the soft magnetic thin film 64d is removed completely from at least the tip surface of the projection 63a. As a result, formed are the thin film yokes 64b, 64c positioned to face each other with the projection 63a interposed therebetween as shown in FIG. 17M. Incidentally, after formation of the thin film yokes 64b, 64c, the first protective film 30 remaining on the thin film yokes 64b, 64c is completely removed in the step shown in FIG. 17M. However, it is possible for the first protective film 30 to be partly left unremoved on the thin film yokes 64b, 64c. Also, it is possible to employ the extra film removing method in place of the mechanical polishing method or the etch back method.

The step for forming the electrode will now be described. The step for forming the electrode is carried out by the procedures similar to those in the first embodiment of the present invention described previously. Specifically, a photoresist film 38 is newly formed on the surface of the insulating substrate 62 except the regions where the electrodes 68b, 68c are to be formed, followed by depositing an electrode material 68a on the photoresist film 38 as shown in FIG. 17N and subsequently removing (lifting off) the photoresist film 38 as shown in FIG. 17O. By the procedures described above, it is possible to form the electrodes 68b and 68c in the edge portions of the thin film yokes 64b and 64c, respectively. Incidentally, the electrode 68b alone is shown in FIG. 17O.

Then, the second protective film 72 is formed on the surface of the insulating substrate 62 by carrying out the step for forming the surface protective layer by the procedures similar to those in the first embodiment of the present invention described previously so as to obtain the thin film magnetic sensor 60 according to the third embodiment of the present invention.

The function and effect of the thin film magnetic sensor 60 according to the third embodiment of the present invention will now be described. The thin film magnetic sensor 60 according to the third embodiment of the present invention is prepared by forming the GMR film 66, which is longer than the gap length in the direction of the gap length, on the surface of the insulating substrate 62, followed by depositing the fourth protective film 70 on the GMR film 66 and subsequently forming the projection 63a and, then, depositing the soft magnetic thin film 64d. It should be noted that, in the thin film magnetic sensor 60 for this embodiment, an electric area-to-area contact can be achieved without fail between the upper surface of the GMR film 66 and the lower surfaces of the thin film yokes 64b, 64c. It follows that the contact electrical resistance between the thin film yokes 64b, 64c and the GMR film 66 is not appreciably changed even if the manufacturing conditions are slightly changed so as to stabilize the magnetic characteristics of the thin film magnetic sensor 60.

EXAMPLES

Example 1

Figure 20A:
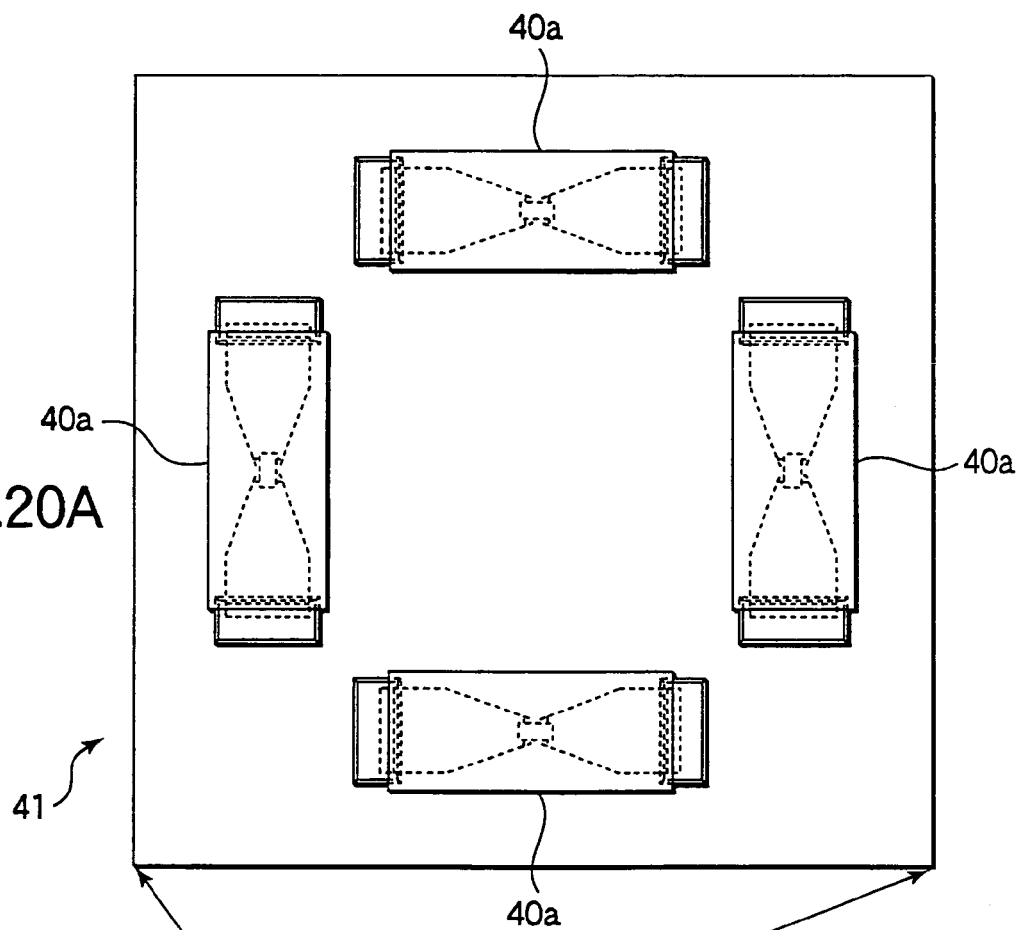
FIGS. 20A and 20B collectively show the arrangement of the unit elements within the chip manufactured in Example 1 of the present invention.
Figure 20B:
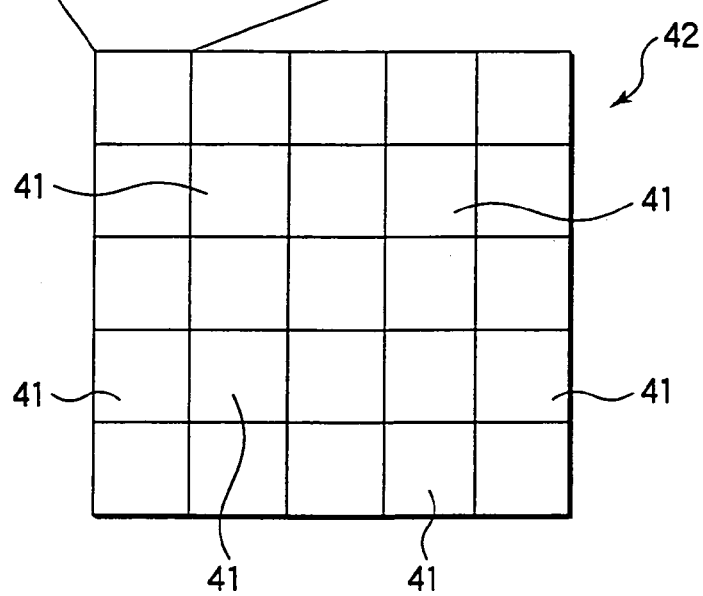

A thin film magnetic sensor 40 that was constructed as shown in FIGS. 9 to 11 was manufactured by the method shown in FIGS. 13A to 13P. In this Example, 25 element groups (chips) 41 were formed on a single insulating substrate 42, as shown in FIG. 20B. Each element group (chip) 41 included 4 unit elements 40a each consisting of a single GMR film 46 and a pair of thin film yokes 44b, 44c arranged on both sides of the GMR film 46 as shown in FIG. 20A. It follows that 100 unit elements 40a in total were formed on the single insulating substrate 42.

A nonalkali glass substrate was used as the insulating substrate 42. The GMR film 46 was formed of a metal-insulator system nano granular material having a composition of FeCo—MgF$_2$. Further, a CoFeSiB amorphous film was used as each of the thin film yokes 44b and 44c. The thickness of each of the thin film yokes 44b and 44c was set at 1.0 µm. The thickness of the GMR film 46 was set at 0.5 µm. Further, the gap length was set at 2.0 µm. Also, after deposition of the soft magnetic thin film 44d, the soft magnetic thin film 44d was partially removed by the extra film removing method so as to expose the tip surface of the projection 43a to the outside.

Example 2

Twenty-five chips (or 100 unit elements in total) were formed on the insulating substrate 42 by the procedures equal to those for Example 1, except that the etch back method was employed for partially removing the deposited soft magnetic thin film 44d until the tip surface of the projection 43a was exposed to the outside.

Comparative Example 1

Figure 1:
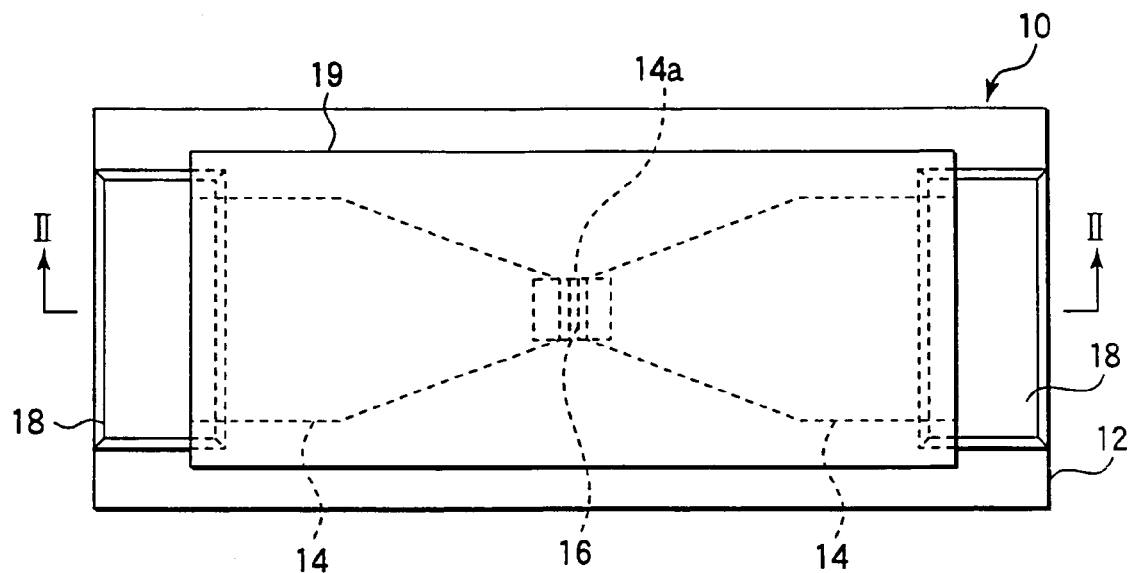
FIG. 1 is a plan view schematically showing the construction of the conventional thin film magnetic field sensor.
Figure 2:
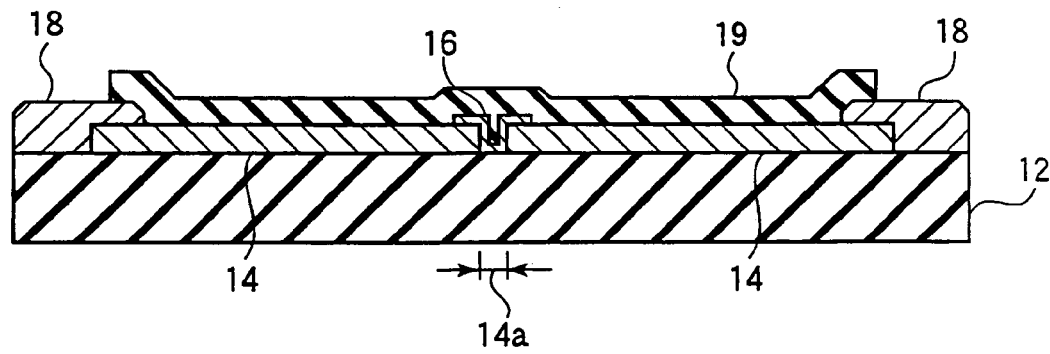
FIG. 2 is a cross sectional view along the line II—II shown in FIG. 1.
Figure 3:
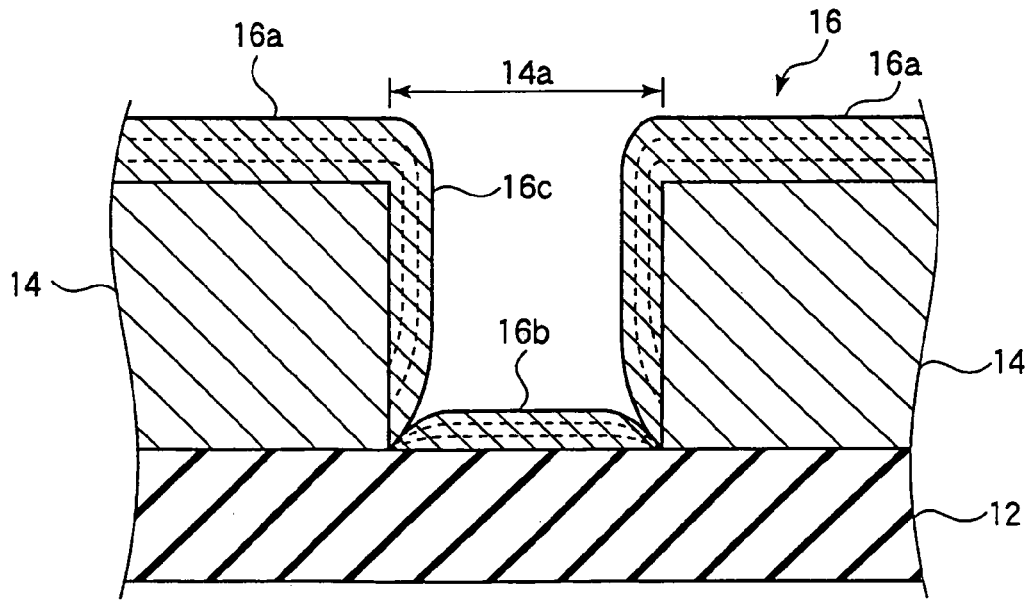
FIG. 3 is a cross sectional view showing in a magnified fashion the region in the vicinity of the gap included in the conventional thin film magnetic field sensor.

Sixteen chips each including 4 thin film magnetic sensors 10 as unit elements, i.e., 64 unit elements (thin film magnetic sensors 10) in total, which were constructed as shown in FIGS. 1 to 3, were manufactured as follows. Specifically, a soft magnetic thin film consisting of a CoFeSiB amorphous was deposited in a thickness of 1.0 µm on the surface of an insulating substrate 12 of a no-alkali glass substrate. Then, the soft magnetic thin film was partially etched so as to form thin film yokes 14, 14, which were positioned to face each other with a gap (groove) 14a having a gap length of 2.0 µm interposed therebetween.

In the next step, a GMR film 16 consisting of a metal-insulator system nano granular material having a composition of FeCo—MgF$_2$ was deposited in a thickness of 0.5 µm on the surface of the insulating substrate 12 with a mask arranged to cover the surface of the insulating substrate 12 except the region of the gap 14a. Further, electrodes 18, 18 were formed on the edge portions of the thin film yokes 14, 14, followed by forming a protective film 19 in a manner to cover the surfaces of the thin film yokes 14, 14 and the GMR film 16 so as to obtain the thin film magnetic sensor 10.

The thin film magnetic sensor obtained in each of Examples 1, 2 and Comparative Example 1 was subjected to a heat treatment at 200° C. for 1.0 hour in order to eliminate the internal strain of each of the multilayer films, followed by measuring the electrical resistance (kΩ) and the MR ratio (%) under the magnetic field of 100 (Oe) for each of the unit elements. Further, the variation ΔR in the resistance values of elements within the chip was calculated in accordance with the formula given below by using the electrical resistance values measured for the four adjacent unit elements within the chip $$\Delta R = |R_i - R_j| \times 100 / R_m \ (\%)$$

where $R_i$ and $R_j$ denote the electrical resistance values of the i-th unit element and the j-th unit element, respectively, i and j denote integers of 1 to 4, the values of i and j differing from each other, and $R_m$ denotes the average value of the electrical resistance values of the four unit elements within the same chip.

Figure 18:
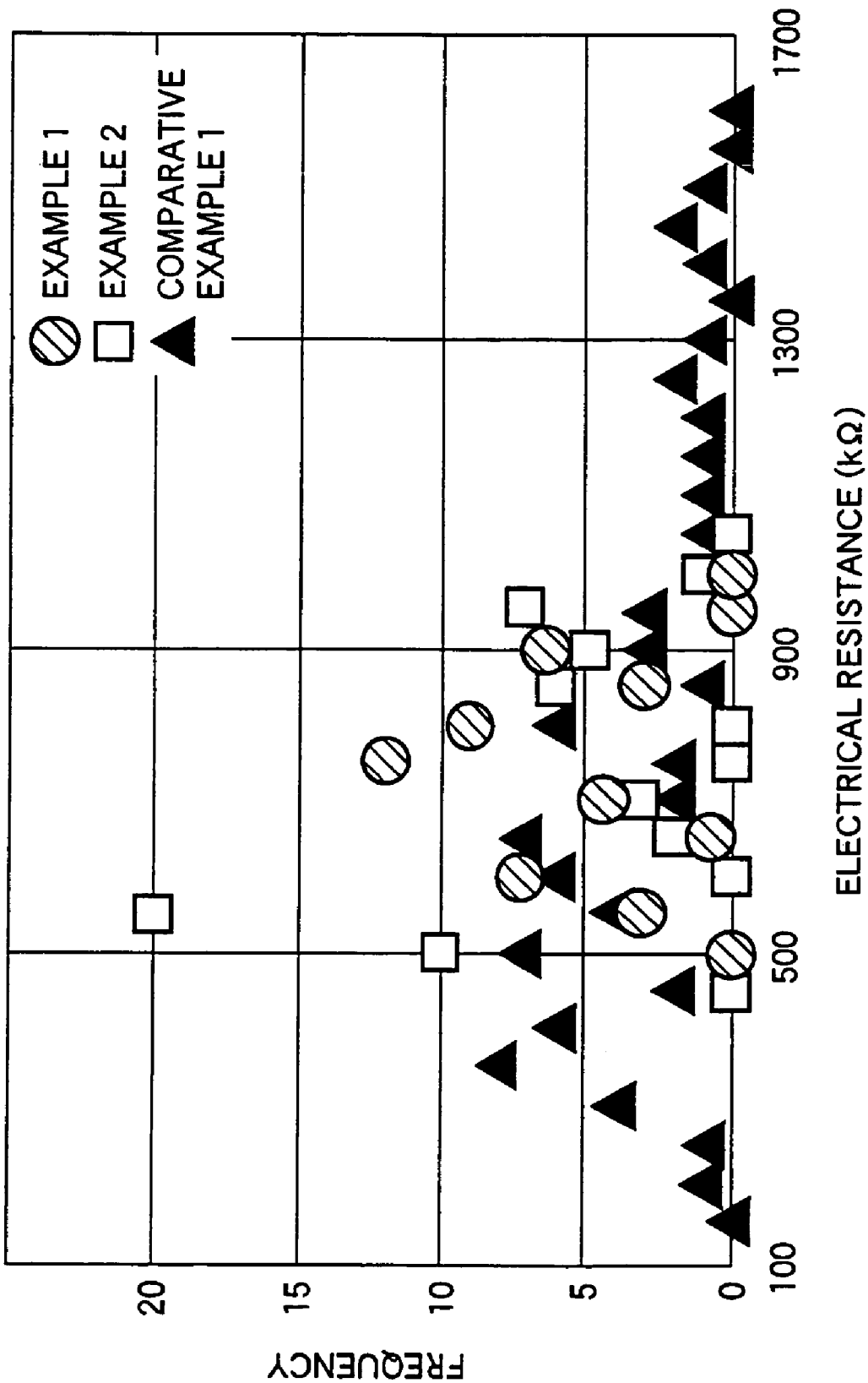
FIG. 18 is a graph showing the relationship between the electrical resistance and the frequency in respect of the thin film magnetic sensor obtained in each of Examples 1, 2 and Comparative Example 1.
Figure 19:
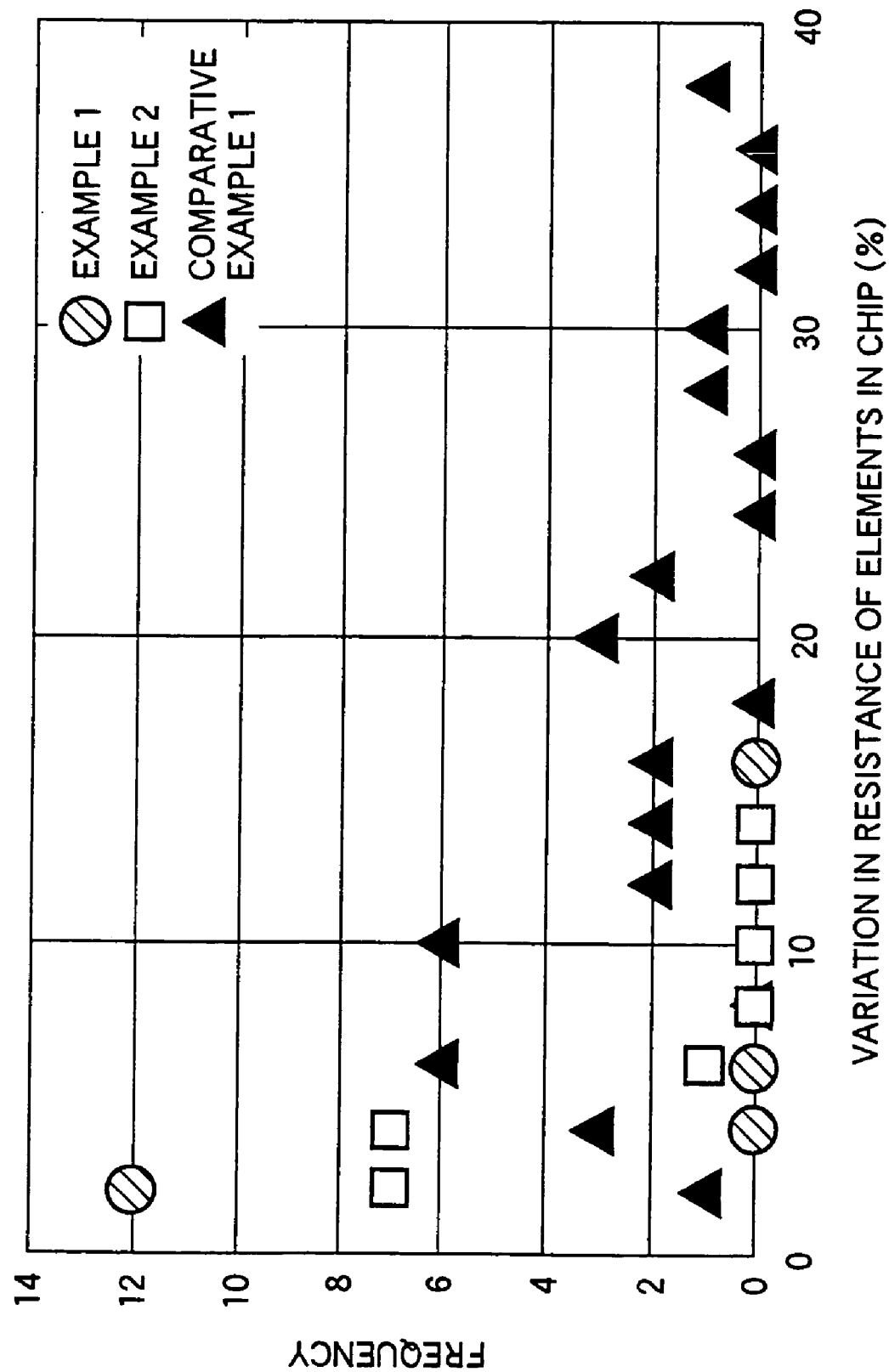
FIG. 19 is a graph showing the relationship between the variation in resistance of the thin film magnetic sensors formed in a single chip and the frequency in respect of the thin film magnetic sensor obtained in each of Examples 1, 2 and Comparative Example 1.

FIGS. 18 and 19 show the distribution of the electrical resistance values of the unit elements and the distribution of the variation ΔR in the resistance values of the elements within the chip, respectively. In the case of the thin film magnetic sensor 10 obtained in Comparative Example 1, the electrical resistance values of the unit elements were distributed over a range of between 100 k$\Omega$ and 1600 k$\Omega$. In other words, the largest resistance value was found to be more than 10 times as large as the smallest resistance value. On the other hand, the variation $\Delta R$ in the resistance values of the elements within the chip for Comparative Example 1 was found to fall within a range of between 2% and 40%. Further, the variation in the MR ratios of the unit elements for Comparative Example 1 was found to fall within a range of between 0% and 6%. It should be noted that only about 10% of all the unit elements exhibited the MR ratio not smaller than 5%, indicating that the yield of the thin film magnetic sensor was very low in Comparative Example 1.

On the other hand, in the case of the thin film magnetic sensors 40 obtained in each of Examples 1 and 2, the electrical resistance values of the unit elements were stable, which were found to fall within a range of between 400 k$\Omega$ and 1000 k$\Omega$. In other words, the variation in the electrical resistance values was very small, compared with Comparative Example 1. Also, the variation $\Delta R$ in the resistance values of the elements within the chip was not larger than 6% in Examples 1 and 2 of the present invention, which was markedly smaller than that for Comparative Example 1. Further, the MR ratio of the unit element was found to fall within a range of 5% and 7% in each of Examples 1 and 2 of the present invention. In addition, the thin film magnetic sensors 40 for the Examples of the present invention exhibited a high MR ratio with a high stability such that each of the unit elements exhibited an MR ratio not lower than 5%.

The embodiments described above are simply intended to clarify the technical concept of the present invention. Of course, the present invention should not be limited to the embodiments described above in interpreting the technical scope of the present invention. The present invention can be worked in variously modified fashions within the spirit of the present invention and within the scope defined by the accompanying claims.

For example, although the element of the present invention having the GMR film and the thin film yokes arranged on both sides of the GMR film is suitable for a magnetic sensor, application of the present invention is not limited to a magnetic sensor. The element of the present invention can also be applied to, for example, a magnetic memory and a magnetic head.

What is claimed is:

1. A method of manufacturing a thin film magnetic sensor comprising the steps of:

depositing a GMR film on a surface of an insulating substrate formed of an insulating nonmagnetic material;

forming a projection by depositing a thin film formed of an insulating nonmagnetic material on the GMR film, followed by removing the thin film except a region forming the projection and partly removing the GMR film, with a region forming the projection left unremoved, until the GMR film is partly or entirely exposed to at least a side wall surface of the projection; and forming a pair of thin film yokes positioned to face each other with the projection interposed therebetween and electrically connected to the GMR film alone, the thin film yokes being formed by depositing a thin film formed of a soft magnetic material having an electrical resistivity lower than that of the GMR film on the surface of the insulating substrate having the projection formed thereon such that the deposited thin film is electrically connected to the GMR film exposed in advance to a side wall surface of the projection, followed by partially removing the thin film formed of the soft magnetic material until at least a tip surface of the projection is exposed to the outside.

2. The method according to claim 1, wherein the thin film yokes have a magnetic permeability not lower than 100, and have a saturation magnetization not lower than 5 kilo Gauss.

3. The method according to claim 2, wherein the GMR film has an absolute value of a MR ratio not smaller than 5%, under the condition that an external magnetic field H is not higher than several ten thousand oersteds (Oe), and the GMR film exhibits an electrical resistivity of $10^3$ $\mu\Omega$ cm to $10^{12}$ $\mu\Omega$ cm.

4. A method of manufacturing a thin film magnetic sensor comprising the steps of:

depositing a GNR film on a surface of an insulating substrate formed of an insulating nonmagnetic material;

forming a projection by depositing a thin film formed of an insulating nonmagnetic material on the GMR film, followed by partially removing the thin film formed of the insulating nonmagnetic material, with a region forming the projection left unremoved, until a surface of at least the GMR film is exposed to the outside; and forming a pair of thin film yokes positioned to face each other with the projection interposed therebetween and connected electrically to the GMR film alone, the thin film yokes being formed by depositing a thin film formed of a soft magnetic material having an electrical resistivity lower than that of the GMR film on the surface of the insulating substrate having the projection formed thereon such that the deposited thin film is electrically connected to the GMR film exposed in advance to the outside, followed by partially removing the thin film formed of the soft magnetic material until at least a tip surface of the projection is exposed to the outside.

5. The method according to claim 4, wherein the thin film yokes have a magnetic permeability not lower than 100 and have a saturation magnetization not lower than 5 kilo Gauss.

6. The method according to claim 5, wherein the GMR film has an absolute value of a MR ratio not smaller than 5%, under the condition that an external magnetic field H is not higher than several ten thousand oersteds (Oe), and the GMR film exhibits an electrical resistivity of $10^3$ $\mu\Omega$ cm to $10^{12}$ $\mu\Omega$ cm.

* * * * *